United States Patent [19]
Dent et al.

[11] Patent Number: 5,631,604
[45] Date of Patent: May 20, 1997

[54] WASTE ENERGY CONTROL AND MANAGEMENT IN POWER AMPLIFIERS

[75] Inventors: Paul W. Dent, Stehag, Sweden; Ross W. Lampe, Raleigh, N.C.

[73] Assignee: Ericsson Inc., Research Triangle Park, N.C.

[21] Appl. No.: 475,659

[22] Filed: Jun. 7, 1995

Related U.S. Application Data

[62] Division of Ser. No. 179,947, Jan. 11, 1994, Pat. No. 5,574,967.

[51] Int. Cl.$^6$ ............................................. H03F 3/68
[52] U.S. Cl. ..................... 330/124 R; 330/149; 330/295
[58] Field of Search .................................. 330/124 R, 149, 330/295; 342/373

[56] References Cited

U.S. PATENT DOCUMENTS

| | | |
|---|---|---|
| 3,649,927 | 3/1972 | Seidel . |
| 3,731,217 | 5/1973 | Gerst et al. ............................... 330/56 |
| 3,917,998 | 11/1975 | Welti . |
| 4,068,186 | 1/1978 | Sato et al. . |
| 4,319,359 | 3/1982 | Wolf . |
| 4,477,781 | 10/1984 | Reuss, Jr. . |
| 4,591,800 | 5/1986 | Opas . |
| 4,595,882 | 6/1986 | Silagi et al. . |
| 4,618,831 | 10/1986 | Egami et al. . |
| 4,868,520 | 9/1989 | Terakawa et al. .................. 330/295 X |
| 4,899,162 | 2/1990 | Bayetto et al. . |
| 4,901,085 | 2/1990 | Spring et al. . |
| 5,012,254 | 4/1991 | Thompson . |
| 5,054,052 | 10/1991 | Nonami . |
| 5,073,751 | 12/1991 | Kaitandjian et al. . |
| 5,093,668 | 3/1992 | Sreenivas . |
| 5,119,042 | 6/1992 | Crampton et al. . |
| 5,192,919 | 3/1993 | Wieczorek . |
| 5,264,807 | 11/1993 | Okubo et al. . |
| 5,351,016 | 9/1994 | Dent . |

FOREIGN PATENT DOCUMENTS

| 226106 | 9/1988 | Japan ....................................... 330/295 |
|---|---|---|

*Primary Examiner*—James B. Mullins
*Attorney, Agent, or Firm*—Burns, Doane, Swecker & Mathis

[57] ABSTRACT

An amplifying apparatus for linearly amplifying a desired signal using a pair of coupled non-linear amplifiers is disclosed. The amplifying apparatus comprises a limiter for separating amplitude variations from the desired signal and producing a constant amplitude signal bearing the phase of the desired signal and an amplitude related signal. In addition, a drive signal generater produces two drive signals each dependent on the constant amplitude signal and the amplitude related signal such that each drive signal depends on the phase of the desired signal and such that the sum of the squares of the amplitudes of the drive signals is constant. Finally, a coupler couples the two drive signals to produce two constant amplitude signals for driving the pair of non-linear power amplifiers and for coupling the outputs of the power amplifiers to produce two amplified output signals, one of which is the linearly amplified desired signal and the other of which is a waste energy signal.

3 Claims, 19 Drawing Sheets

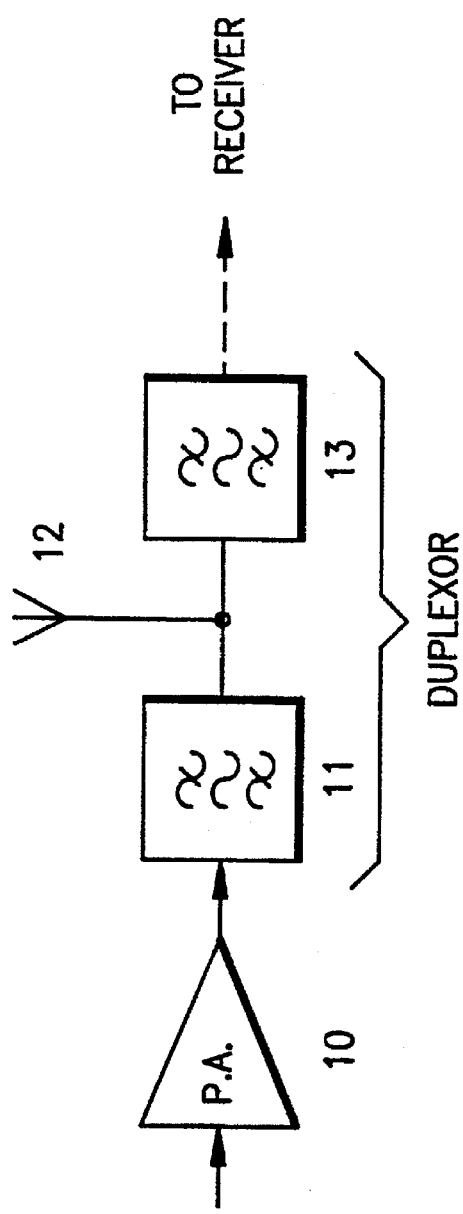
FIG. 1a) PRIOR ART
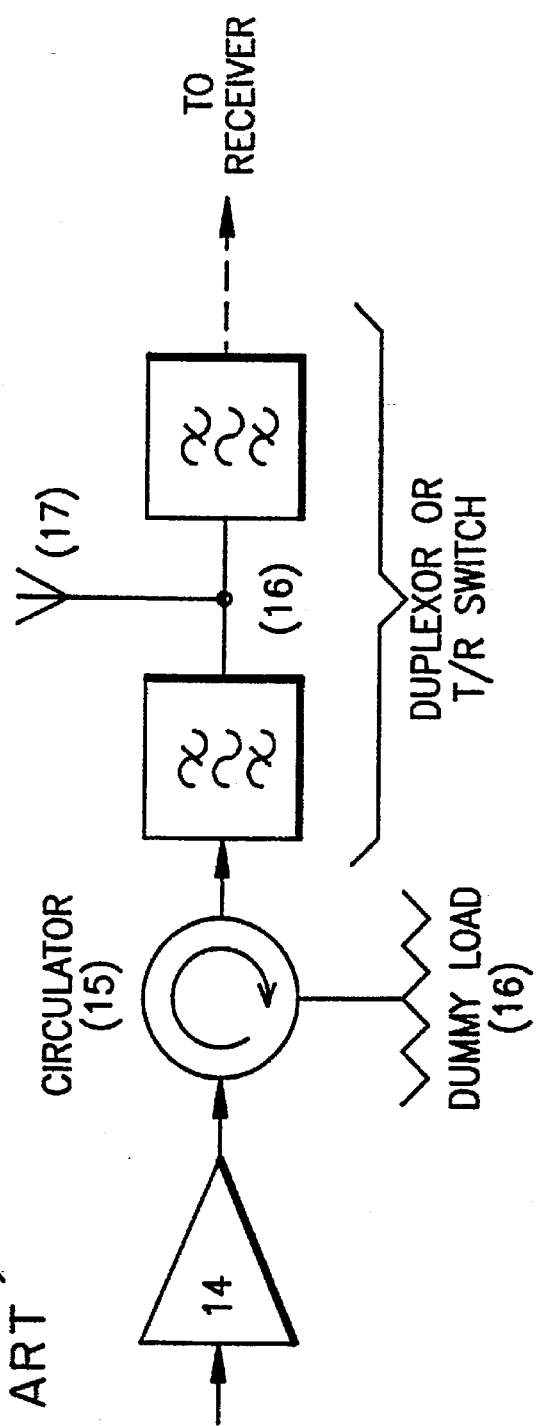
FIG. 1b) PRIOR ART

WASTE ENERGY CONTROL AND MANAGEMENT IN POWER AMPLIFIERS

This application is a divisional, of application Ser. No. 08/179,947, filed Jan. 11, 1994, now U.S. Pat. No. 5,574,967.

FIELD OF THE DISCLOSURE

The present invention relates to class C matrix power amplifiers for use in cellular radio communication systems, and particularly to a satellite cellular radio communication. In addition, the present invention relates to methods for recovering energy that would otherwise be wasted energy in certain power amplifier/antenna combinations.

BACKGROUND OF THE DISCLOSURE

In conventional satellite communications systems, transponders formerly consisted of a number of separate power amplifiers each carrying multiple signals. The operating point of each amplifier was normally set to produce an average output level substantially below the saturated output level of the amplifier in order to maintain linear operation.

However, U.S. Pat. No. 3,917,998 to Welti entitled "Butler Matrix Transponder" describes an arrangement of N coupled power amplifiers for amplifying N signal paths. The N signal paths envisaged comprise the relaying of signals from at least one ground station to N locations on the earth using an orbiting satellite. The benefit of using coupled amplifiers over using a set of N non-coupled amplifiers is that the set of non-coupled amplifiers is limited to generating a power which does not exceed the peak power capability of a single amplifier in any signal path, whereas the technique which uses coupled amplifiers allows the generation of a power equal to the sum of the powers of all the amplifiers in any signal path, provided that all signal paths do not require higher than the mean power at the same time. As a result, signals that vary both above and below a mean power level are accommodated more efficiently due to a better statistical averaging of the power demanded by the N signal paths. The matrix power amplifier of the Welti patent is for use in frequency division multiple access (FDMA) applications, and provides the facility to vary the number of FDMA carrier frequencies used in each signal path and thus correspondingly the power needed in each signal path over a wide range.

A matrix power amplifier according to the Welti patent contains a butler matrix for combining a number N of input signals to be amplified to produce N different combinations of the input signals. In addition, a set of N power amplifiers are provided so that each amplifier amplifies one of the combinations to produce N amplified signals. The matrix power amplifiers also contain a butler matrix for combining the amplified signals to produce N outputs that are amplified versions of the original N input signals. The benefit as compared with simply amplifying the original N inputs in independent amplifiers is the ability, if instantaneously needed, to devote more than the power of a single amplifier to one of the N signal paths. In principle, the matrix power amplifier can deliver the sum of the power output of all amplifiers to a single output.

The characteristics of intermodulation generated by non-linearities in a matrix power amplifier are different than in a single amplifier. It can be shown that third order intermodulation between signals input respectively to inputs I and J of the input butler matrix appears on the output numbers $(2i-j)_n$ and $(2j-i)_n$ of the output butler matrix. As a first step to reducing intermodulation in a matrix power amplifier, one embodiment of the present invention provides an excess number of amplifying paths so that outputs $(2i-j)$ or $(2j-i)$ or their corresponding inputs are not used for desired signal outputs, but are terminated in dummy loads. Thus, third order modulation between signals i and j will not be transmitted. This requires that the number of butler matrix input and output ports M be greater than the number of signals to be amplified N, wherein the remaining M–N signals are terminated in dummy loads.

It is easy to see that if only two signals are to be amplified, then using ports 1 and 2 as inputs and outputs will result in third order intermodulation appearing on ports 0 and 3, which are terminated. It is not so obvious how to achieve this when many signals are present. This problem is however solved by Babcock in another context. Babcock wanted to find a method of allocating frequency channels on an equally spaced grid to signals amplified by the same non-linear amplifiers such that third order intermodulation between any two or three signals would not fall in a channel used by a signal. The mathematical formulation of the problem is the same as for the inventive matrix power amplifier, wherein a set of integers is found I1, I2, I3 ... such that Ii+Ik–Ij is not in the set. The solution is called "Babcock spacing". Babcock applied these integers to choosing among M frequency channels for the transmission of signals. However, the present invention applies Babcocks integer sets to choosing among M physical output channels which are used for N desired signals. Consequently, the first improvement over the prior art matrix power amplifier according to the present invention is to employ a larger matrix than the number of signals to be amplified, and to allocate input and outputs to signals or not according to the Babcock spacing or other optimum allocation, thus insuring that intermodulation emerges principally from outputs that are not allocated to signals.

Furthermore, In the present cellular communications market, there is an emphasis on making mobile telephones small, handheld units which operate from attached, rechargeable batteries. A parameter of great interest to the user of such phones is the length of time that can be spent in conversation without needing to change or recharge the battery. This parameter is simply known as the "talk-time" offered by different types of mobile phones. Of course, it is possible to offer a longer talk-time by using bigger batteries, but the bigger batteries increase the size and weight of the mobile telephone. Therefore, designers and inventors strive to construct devices which achieve longer talk-times for a given battery capacity. During a conversation, the radio transmitter power amplifier is the dominant power consumer. The efficiency of the amplifier's conversion of battery energy into radio energy thus has a direct bearing on the length of available talktime for a cellular mobile telephone.

Cellular telephone systems were first introduced using analog frequency modulation to impress a voice on a radio signal. Analog frequency modulation has the advantage of producing a constant amplitude signal whose phase angle changes. The most efficient transmit power amplifiers can be constructed for constant amplitude signals which operate in a saturated output mode.

Original cellular systems using analog frequency modulation were also duplex, meaning that they received a signal in the reverse direction at the same time as transmitting a signal. A device known as a duplexer was therefore needed to couple both the transmitter and the receiver to the same antenna so as to avoid interference. As shown in FIG. 1(a), the antenna 12 is connected to the duplexer 16, which is formed by the filters 11 and 13. The duplexer 16 then controls the signals to and from the power amplifier 10 and the receiver 14 so as to avoid interference. FIG. 1(b) illustrates the addition of an isolator 15 in the transmit path which is used in some cases to protect the transmitter against antenna mismatches and/or to protect the transmitter from other signals picked up on the antenna and fed back to the transmitter causing an undesired phenomenon known as back-intermodulation. The isolator 15 diverts signals reflected from the antenna mismatches or received from other sources into a dummy load 18. The prior art does not disclose recycling of the energy diverted to the dummy load in order to increase the talk-time of handheld radios. A transmitter power amplifier illustrated in FIG. 1(a) can be a single power amplifier.

A transmitter power amplifier can also be constructed by combining two similar, smaller sized amplifiers. If the amplifier devices are driven in antiphase and their outputs are combined with a 180 degree relative phase so that their outputs add constructively, the amplifier is known as a push-pull amplifier. Sometimes, two similar amplifiers 20 and 21 can be driven 90 degrees out of phase and their outputs combined using a 90 degree or quadrature coupler as illustrated in FIG. 2. The quadrature coupler 23 can be formed by running two strip transmission lines in parallel proximity to each other. The energy is transferred between the lines in such a manner that a signal flowing from left to right on one line induces a signal flowing from fight to left on the other line but with a 90 degree phase shift. Thus, two amplifiers connected respectively to the left hand end of a first line and the fight hand end of a second line will produce signals travelling from left to fight on the first line and from fight to left on the second line.

When the amplifiers are approximately driven 90 degrees out of phase, the net signal flowing on the first line becomes a sum signal and the net signal flowing on the second line is a difference signal, which can be arranged to be zero. The output of the difference line is usually terminated in a dummy load 24 which normally dissipates no power. Practical tolerances of the matching between the amplifiers, the accuracy of the phase shift, energy at harmonic frequencies or antenna mismatch at the sum line output can however result in significant energy dissipation in this dummy load. The prior art does not disclose recycling this otherwise wasted energy in order to increase the talk-time of a handheld radio.

Yet another configuration of a power amplifier, known as a feedforward amplifier, may be employed in some circumstances, in which linear power amplification rather than saturated power amplification of class C amplifiers is desired. In feedforward power amplifier configurations, a more or less non-linear amplifier 30 produces an output signal that is then corrected by adding an error signal, which is produced by an error amplifier 31, to the output signal using a directional coupler 32 as described above and as is shown in FIG. 3. A waste energy signal normally produced in dummy load 33 corresponds to the unwanted difference signal. The unwanted difference signal is always produced when two dissimilar signals having overlapping spectra are added together. Again, the prior art does not disclose the recycling of the waste energy produced by the difference signal in order to increase talk-time.

SUMMARY OF THE DISCLOSURE

It is an objective of the present invention to overcome the deficiencies of the prior art and to provide an effective means to amplify multiple signals to a transmitted power level using power amplifiers adapted for efficiently amplifying signals of constant amplitude, such as Class C amplifiers, while avoiding high levels of intermodulation products.

One embodiment of the present invention discloses an amplifying apparatus for linearly amplifying a desired signal using a pair of coupled non-linear amplifiers. The amplifying apparatus comprises limiting means for separating amplitude variations from the desired signal and producing a constant amplitude signal bearing the phase of the desired signal and an amplitude related signal. In addition, a drive signal generation means produces two drive signals each dependent on the constant amplitude signal and the amplitude related signal such that each drive signal depends on the phase of the desired signal and such that the sum of the squares of the amplitudes of the drive signals is constant. Finally, a coupling means couples the two drive signals to produce two constant amplitude signals for driving the pair of non-linear power amplifiers and for coupling the outputs of the power amplifiers to produce two amplified output signals, one of which is the linearly amplified desired signal and the other of which is a waste energy signal.

Another embodiment of the present invention relates to a system for communicating using a first station with a first plurality of second stations using a phased array antenna. The system comprises signal generating means for generating a first plurality of signals for transmission to respective second stations using radio wave modulation. Combining means then produce a second plurality of combined signals which are complex weighted sums of the first plurality of signals, wherein the second plurality corresponding to the number of antenna array elements disposed along a first dimension of the phased array. In addition, drive signal generation means produce from each of the second plurality of signals a third plurality of signals, the number of which corresponding to different groups of elements disposed along a second dimension of the phased array. Amplifying means are provided for amplifying the second plurality of signals with the third plurality of signals using respective transmit power amplifiers adapted to transmit constant amplitude signals. Finally, an antenna means is connected to the amplifying means such that wanted signals are radiated in desired directions and unwanted signals are dissipated in other directions.

In another embodiment of the present invention, the present invention relates to methods of transponding a multiplicity of TDMA signals from a satellite in a satellite communications system, and in particular to an arrangement of the satellite power amplifiers so as to provide some flexibility for raising the power level in certain TDMA time-slots.

It is another object of the present invention to overcome the problems cited above by recovering the waste energy produced by the power amplifier in order to increase the amount available talk time for a handheld mobile telephone. One embodiment of the present invention relates to a device for increasing the energy efficiency of an amplifier using feed forward linearization. The device comprises a direct current power source which provides power to the amplifier which produces a main output signal. A second amplifier amplifies an error signal. A combining network then combines the error signal with the main signal to produce a corrected sum signal and a wasted energy signal. Finally, a rectifier converts the wasted energy signal into a direct current that is coupled back to the direct current power source in order to reduce the net power consumption.

DETAILED DESCRIPTION OF THE DRAWINGS

These and other features and advantages of the invention will be readily apparent to one of ordinary skill in the an from the following description, used in conjunction with the drawings, in which:

FIGS. 1(a)–2(b) illustrate a conventional power amplifier coupling to an antenna;

DETAILED DESCRIPTION OF THE PREFERRED EMBODIMENTS

Figure 4:
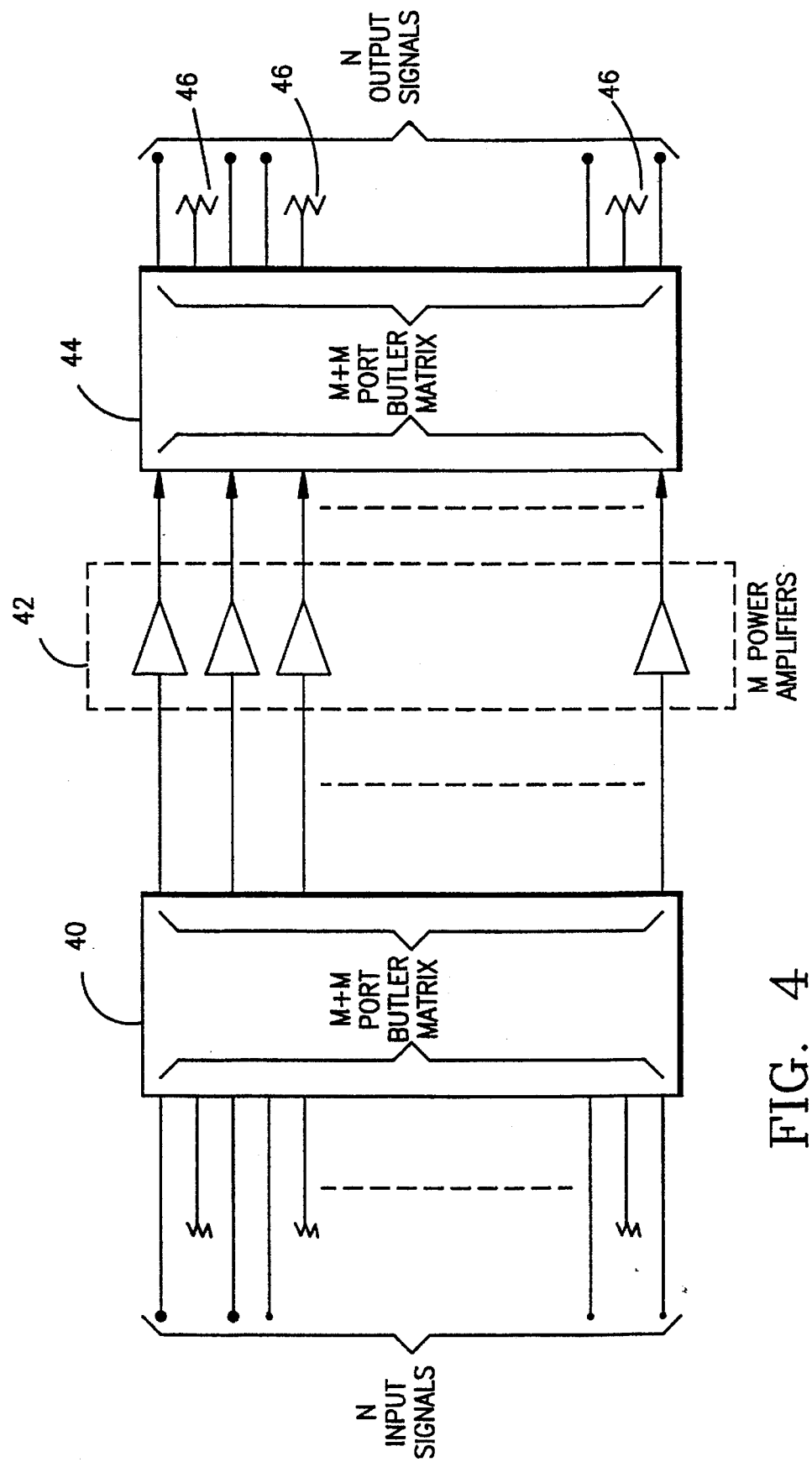
FIG. 4 illustrates an over-dimensioned matrix power amplifier according to one embodiment of the present invention.

An overdimensioned matrix power amplifier according to one embodiment of the present invention is illustrated in FIG. 4. A set of N input signals is connected to the input ports of an M+M port buffer matrix 40 chosen according to Babcock or other optimum spacing. To apply Babcock spacing, the butler matrix ports are numbered with increasing integers according to the phase increments with which successive input signals appear combined at the outputs. For example, port 0 refers to the butler matrix output corresponding to the sum of the input signals with no phase shift. Port 1 refers to the output corresponding to the sum of input signals with an increasing phase shift in the series 0, d $\Phi$, 2d $\Phi$, 3d $\Phi$, etc. Port 2 corresponds to phase shifts 0, 2d $\Phi$, 4d $\Phi$, 6d $\Phi$ . . . etc. The M outputs of the buffer matrix 40 are amplified in non-linear power amplifiers 42. Amplifier outputs are combined using a similar M+M port buffer matrix 44 and the N Babcock-spaced output ports yield desired amplified signals, while the remaining M–N signals are terminated to dissipate unwanted intermodulation as heat or energy in dummy loads 46.

An extreme case of the above occurs when non-linear power amplifiers 42 are saturated class-C amplifiers. The output signal of a class-c amplifier is characterized only by its instantaneous phase, so the general problem can be stated as finding M phases that will result in the N arbitrary signals being approximated as closely as possible with intermodulation and distortion being directed to M–N terminated ports. This problem is solved in the present invention by realizing that to define N arbitrary output signals, 2N degrees of freedom are necessary, as the arbitrary signals have both a real and an imaginary part. Thus, if each input signal can only vary in phase, it has only one degree of freedom and 2N must be specified in order to synthesize the N arbitrary signals.

Consequently, a 2N-channel matrix power amplifier with a 2N+2N port Butler matrix combining its outputs allows N amplified output signals to be reproduced exactly at N of the output ports of the Butler matrix, with all intermodulation being collected at the other N ports which are terminated in dummy loads, providing that a method of deriving 2N phase-varying or constant-envelope signals can be found such that selected N combinations produced by the Butler matrix equate to the N desired signals.

One method is to use N configurations of constant-amplitude amplifier pairs to amplify each of the N varying-amplitude signals. Each pair of amplifiers in this arrangement is driven with a pair of constant amplitude signals having a mean phase equal to that of a wanted signal and a phase difference equal to twice the ARCOSINE of the ratio of the instantaneous desired signal amplitude to its peak amplitude. A hybrid junction can then be used to form the sum and difference of the amplifier pair's output signals, the sum having the desired phase and amplitude and the difference being terminated in a dummy load or subjected to a waste energy recovery technique which will be described further below.

Figure 5:
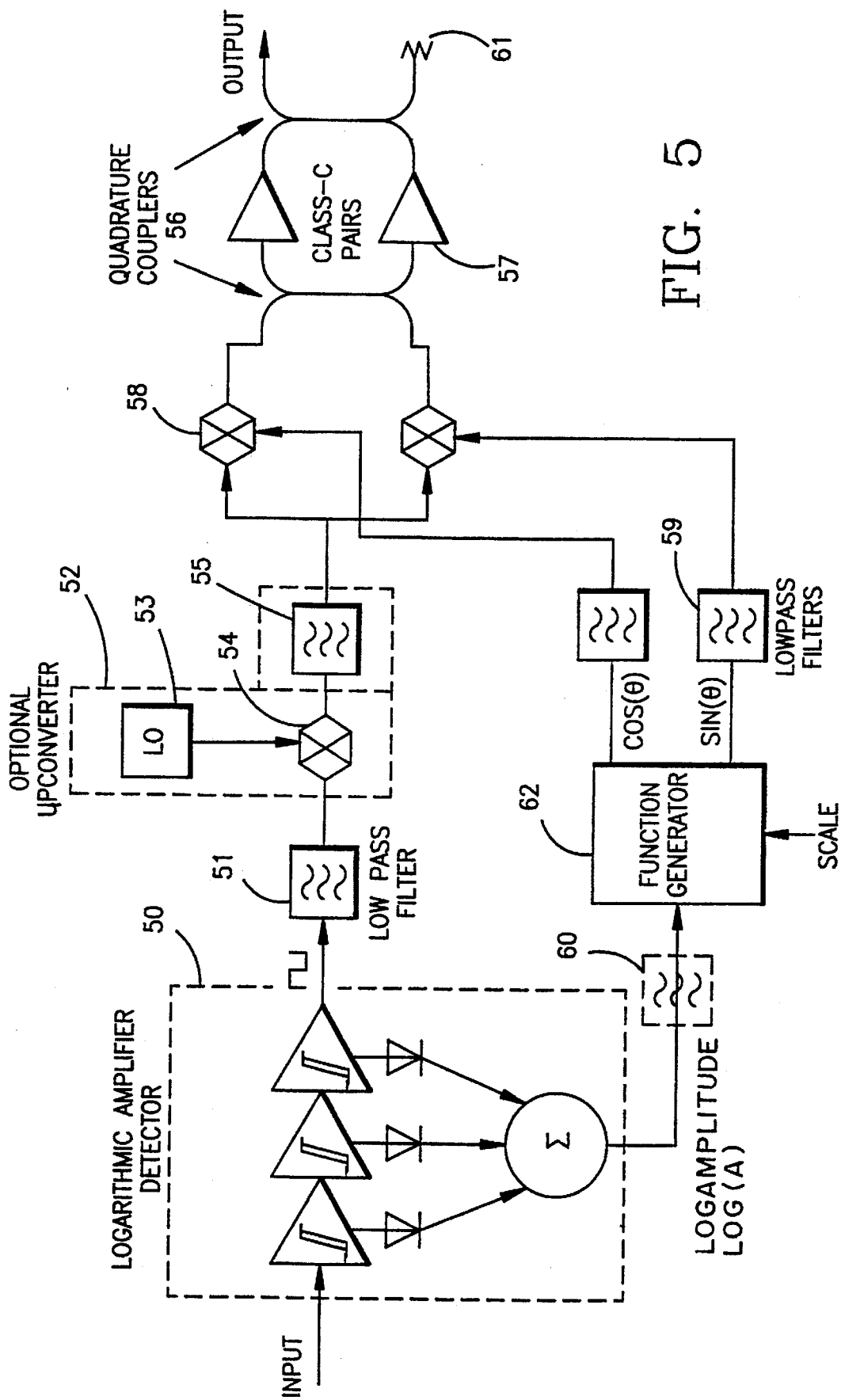
FIG. 5 illustrates a Class C linear power amplifier according to one embodiment of the present invention.

FIG. 5 illustrates a linear power amplifier using class-C according to one embodiment of the present invention. A logarithmic amplifier/detector 21 can if more convenient operate at a lower, intermediate frequency than that to be amplified by the power amplifiers. In this case, an optional upconvertor 52 consisting of a local oscillator 53, a mixer 54 and a selective filter 55, is used to convert the intermediate frequency to the final frequency. Otherwise, the amplifier 21 can in principle operate directly at the final frequency and the upconvertor 23 may be omitted.

The amplifier 21 is of a known type and produces a hard-limited output signal which preserves phase information but has amplitude variations removed. The input signal's amplitude variations are encoded by the logarithmic amplifier's progressive detection process into a signal proportional to the logarithm of the amplitude which, after optional low-pass filtering in low pass filter 60, is applied to a function generator 62. The function generator 62 converts the time-varying logamplitude signal into two time varying signals labelled COSΘ and SINΘ to indicate that the sum of their squares is always unity. COSΘ is equal to the ratio of instantaneous amplitude to peak amplitude, or, expressed in terms of logamplitudes, is the antilog of the difference between instantaneous logamplitude and peak logamplitude. The peak logamplitude can either be determined by the function generator 62 over a sufficiently long period, or set from outside by means of a "SCALE" input. The SINΘ function is merely $\sqrt{1-COS^2\Theta}$. One means of implementing such a function generator is by digitizing LOG(A) and then using digital signal processing circuitry comprising function look-up tables. Analog means can also be used however, employing diode or transistor networks that synthesize a piece-wise linear approximation to the desired functions.

In the digital implementation, the LOGAMPLITUDE signal is sampled and digitized at a rate at least equal to the total signal bandwidth. The SCALE signal is set to the peak of the LOGAMPLITUDE signal and subtracted from it to produce a value equal to the LOG of the ratio of instantaneous to peak amplitude. This value is always negative but may of course be complemented to produce a digital value that is always positive. This binary value between 000 ... 000 and 111 ... 111 is then used as the address to a pre-computed table of corresponding $\cos(\Theta)$ and $\sin(\Theta)$ values. The values are precomputed using the formula $\Theta=2ARCOSINE[EXP(-\lambda A)]$ where A is the address and Ms a suitable scaling value depending on the number of bits of the address and their significance is to make the resultant Θ value equal to twice the ARCOSINE of the instantaneous to peak amplitude ratio. The digital $\cos(\Theta)$ and $\sin(\Theta)$ values are then convened to analog voltage waveforms using D to A convertors and low-pass filters.

The COSΘ and SINΘ functions are used to multiply the constant amplitude signal supplied by the logarithmic amplifier 50, the low-pass filter 51 and the upconvertor 52 if used. The multiplier 58 effectively re-applies the amplitude modulation removed by the hard limiting amplifier 50 on the upper channel while applying a complementary amplitude modulation to the lower channel such that the sum of the squares of the new amplitudes A1 and A2 is unity. This arises through choice of the functions COSΘ and SINΘ whose sum square is automatically unity. The new signals from the multipliers 58 are $A1 \cdot EXP(j\Phi)$ and $A2 \cdot EXP(j\Phi)$ where Φ is the phase of the original input signal. These two signals are combined using a quadrature coupler 56 at the inputs of the class-C power amplifier to produce $(A1+jA2)EXP(j\Phi)$ and $(A2+jA1)EXP(j\Phi)$. Since the sum of the squares of the real and imaginary parts of these are by design unity, the class-C power amplifiers 57 receive constant amplitude drive signals so as to operate at maximum efficiency. The entire chain of components described up to the quadrature coupler 56 is suitable for integration on a small, low-cost silicon chip with a size of only 3 mm×3 mm.

The two matched, class-C power amplifier stages 57 amplify their respective constant amplitude signals and then recombine their outputs using the second of the couplers 56. One output of the coupler 56 is $GA1 \cdot EXP(j\Phi)$ while the other output of the coupler 56 is $GA2 \cdot EXP(j\Phi)$ where G is the amplification gain. The first output is the desired output signal which represents the original input signal and its phase and amplitude variations. The second output is a waste energy signal that is either dissipated as heat in a dummy load 61 or subjected to the waste energy recovery process as will be described below. It will be appreciated that, by using the above technique, the peak power of the output signal is limited to the sum of powers of the two class-C power amplifiers 57.

According to another embodiment of the present invention, N signals are defined which are the N+N port Butler matrix combinations of N signals to be amplified. This can be done if desired by digital signal processing using a Fast Walsh Transform. Then each of the N transformed output signals is amplified by converting to a pair of constant amplitude vectors, for example, using the technique illustrated in FIG. 5, that are amplified using 2N class-C power amplifiers. The 2N power amplifier outputs are then combined in pairs to produce N wanted signals and N waste energy signals, and the N wanted signals recombined using an output N+N port Butler matrix. The N waste energy signals may be terminated in dummy loads which dissipate unwanted intermodulation as heat, light, other electromagnetic radiation, or subjected to a waste energy recovery process as will be described below.

Figure 6:
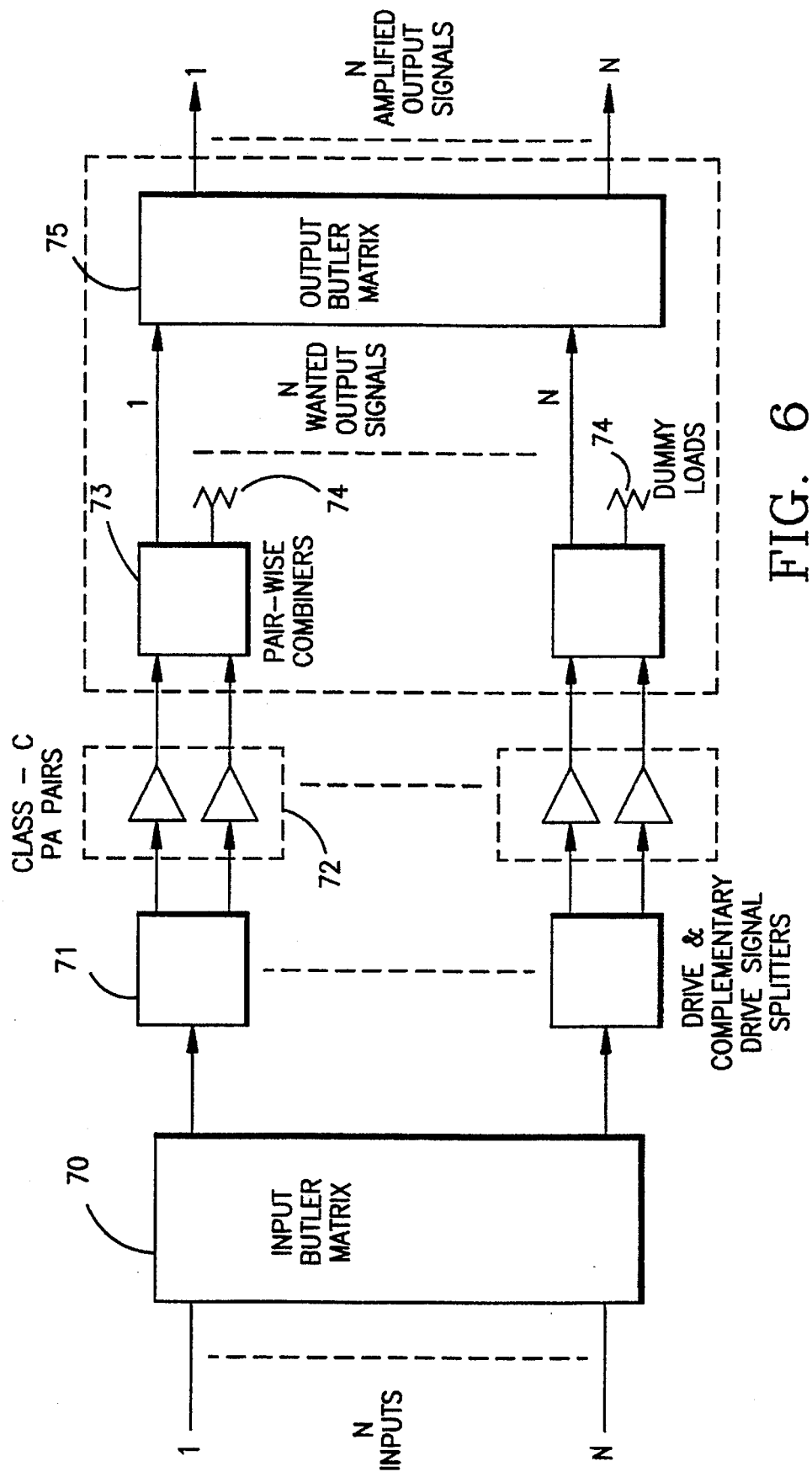
FIG. 6 illustrates an N channel matrix power amplifier using two N Class C amplifiers according to one embodiment of the present invention.

The advantage of the above is that any signal can at the output momentarily reach a level equal to the sam of all 2N amplifier output powers if needed. This arrangement is shown in FIG. 6.

N input signals are combined in an N+N port input Butler matrix 70 to produce N output signals. These are split into DRIVE and COMPLEMENTARY DRIVE signals in drive signal splitters 71 according to the above described procedure so that each signal is a constant amplitude signal. These constant amplitude signals may be amplified efficiently by the N pairs of class-C power amplifiers 72, whose outputs are then pair-wise combined in combiners 73 to produce N wanted signals and N waste energy signals. The waste energy signals are dissipated in dummy loads 74 as heat, while the N wanted signals are decombined in output Butler matrix 75 to produce the original N input signals at an amplified power level. As a result, unwanted intermodulation products are dissipated as heat, light, or other electromagnetic radiation in dummy loads 74.

The combination of pair-wise combiners 73 and the N+N port Butler matrix 75 may be recognized as a 2N+2N port combining network with 2N inputs (from the 2N class-C power amplifiers 72) and 2N outputs (of which N are terminated in dummy loads). It is in fact a partial construction of a 2N+2N port Butler matrix that has been simplified by removing stages that merely complete the recombination of waste energy signals unnecessarily. In general, the 2N+2N output combining matrix of such a device does not need to be a full Butler matrix but can be simplified to its Fast Walsh Transform equivalent through deletion of fractional phase shifters or separation into groups of smaller transforms. In general, it is desirable that at least the wanted output signals are constituted as combinations of all the power amplifier signals such that maximum flexibility exists to vary the output power of each signal up to the sum of all the powers of the power amplifiers, should that be instantaneously needed.

According to another embodiment of the present invention, the above-described process can be used to increase. the output power in certain timeslots used for transmitting paging calls to mobile phones, to increase the probability of reception.

In a TDMA system, each communication signal is allocated a portion of a time-multiplex frame period, called a time slot, on a common carrier frequency. In a TDMA system, it may be desirable to have the flexibility to raise the power level in certain time slots. A higher power level can, for example, be needed to communicate with a mobile Found terminal that is temporarily suffering a signal attenuation due to buildings, trees, or some other object. A higher power level can also be desirable in the timeslots used for broadcasting paging messages to mobile terminals in order to guarantee reception while their antennas are in a stowed position.

This embodiment of the present invention comprises a multi-beam satellite antenna for dividing the area illuminated on the earth into cells. A matrix power amplifier is provided with an output corresponding to each antenna beam and comprised of a plurality of power amplifiers connected by means of Butler matrices at their outputs to provide each beam signal. Means are also provided to TDMA-modulate to vary the power level of the drive signals on a timeslot by timeslot basis. Means are also provided to inhibit transmission on groups of unused timeslots on any TDMA signal such that available power amplifier power can during that period be taken up by increasing the drive signals in another beam. The TDMA modulation and power varying means are preferably located on the ground. A ground station comprises the necessary signal generation for each beam signal and transmits these to the satellite. Moreover, the matrix-PA input Butler matrix combiners can also preferably be located on the ground whereby the ground station produces already combined drive signals for directly driving each of the power amplifiers and these signals are transmitted to the satellite by means of coherent feeder links as disclosed in U.S. patent application Ser. No. 08/179,953, entitled "A Cellular/Satellite Communications System With Improved Frequency Re-use", filed Jan. 11, 1994, which is expressly incorporated by reference.

In the case where one or two timeslots in each beam is allocated for a paging/calling channel of higher power than a traffic channel, the timeslots are deliberately staggered as between the N different outputs such that no two outputs demand high power in the same timeslot. In this way a large power increase such as a factor of ten may be achieved in one signal path at a time without drawing too much of the total available power amplifier power.

Figure 7:
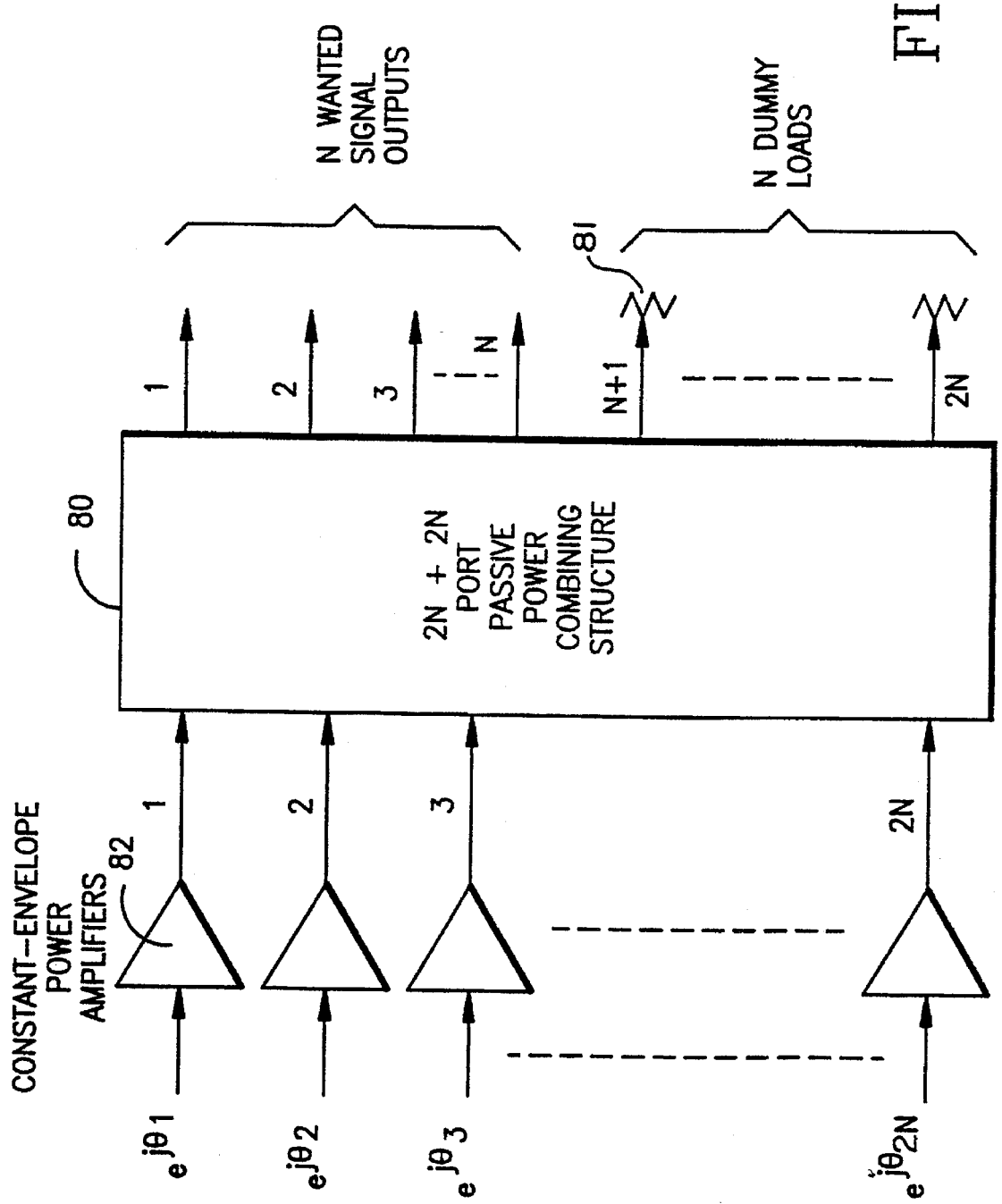
FIG. 7 illustrates a general Class C matrix power amplifier according to one embodiment of the present invention.

In the general formulation of the class-C matrix power amplifier, drive signals for 2N constant-amplitude power amplifier stages should be constructed in order to produce N signals with a desired amplitude and phase modulation at N of the output ports of a 2N+2N port output combining network and a further N waste energy signals at the other N output ports which may be dissipated as heat in dummy loads or subject to a waste energy recovery process which will now be disclosed with reference to FIG. 7.

A completely general passive combining structure 80 combines the outputs of 2N power amplifier stages 82 to produce N wanted signals and N unwanted signals that are dissipated in dummy loads 81 as heat or light. In a satellite application, the latter can be achieved by use of incandescent filament lamps as the dummy loads, and the resultant light focused back on the solar cell array. The passive combining network can be the known prior art Butler matrix, or a reduced Butler matrix formed by omitting combining waste energy signals, or a simplified Butler matrix corresponding to a Fast Walsh Transform structure as opposed to the usual FFT structure.

The general combining structure can be represented as a 2N by 2N matrix having complex coefficients Cij. The complex coefficients Cij describe both the phase and amount of signal voltage or current transfer from power amplifier number j to output port number i. Thus the N desired output signals may be expressed as where GAIN is the intended amplification through the device.

$$\begin{bmatrix} S1 \\ S2 \\ S3 \\ \vdots \\ \vdots \\ Sn \end{bmatrix} = \begin{bmatrix} C11\ C12\ C13\ C14\ \ldots\ C(1,2n) \\ C21\ C22\ \ldots\ C(2,2n) \\ \vdots \\ \vdots \\ C(2n,1)\ \ldots\ C(2n,2n) \end{bmatrix} \times \begin{bmatrix} EXP(j\Theta 1) \\ EXP(j\Theta 2) \\ \vdots \\ \vdots \\ EXP(j\Theta 2n) \end{bmatrix} \times GA1$$

These equations have N complex (2N real) conditions to be satisfied (the N real and N imaginary parts of the desired signals Si), and 2N degrees of freedom (the 2N phases $\Theta j$). However the non-linear nature of these equations hampers their direct solution for the phases $j\Theta$. Instead, in the present invention, the equations are differentiated to obtain a set of linear equations for the changes in phases $D\Theta j$ needed such that the desired signals Si will change from their previous values $\underline{S}(k-1)$ to their new intended values $\underline{S}(k)$. Thus we obtain:

$$\underline{S}(k) - \underline{S}(k-1) = j\text{GAIN} \cdot C \cdot T \cdot \underline{dT}$$

where C is shorthand notation for the coefficient matrix, and T is the diagonal matrix $$\begin{bmatrix} EXP(j\Theta 1)\ 0\ 0\ 0\ \ldots\ 0 \\ 0\ EXP(j\Theta 2)\ 0\ 0\ 0\ \ldots\ 0 \\ 0\ 0\ EXP(j\Theta 3)\ 0\ 0\ 0\ \ldots\ 0 \\ \ldots \\ 0\ 0\ 0\ 0\ 0\ 0\ \ldots\ EXP(j\Theta 2n) \end{bmatrix}$$

and dT is a vector of the 2N phase changes to be found.

By denoting the product $j\text{GAIN} \cdot C \cdot T$ by the N by 2N complex matrix U, and the difference between successive signal samples $S(k)-S(k-1)$ as $\underline{dS}$, the following equation is obtained:

$$U \cdot \underline{dT} = \underline{dS}$$

The N by 2N complex matrix U may be regarded as a 2N by 2N real matrix if the N×2N real coefficients URij are row-interleaved with the N×2N imaginary parts UIij in the following pattern:

UR11 UR12 UR13 . . . UR(1,2n)
UI11 UI12 UI13 . . . UI(1,2n)

UR21 UR22 UR23 . . .
UI21 UI22 UI23 . . .
UR . . .
UI . . .

.
.
.

UR . . .
UI . . .                UI(n,2n)

Likewise, the N complex dS values comprise 2N real values and can be regarded as a 2N point real vector by interlacing real and imaginary parts vertically. Thus, the N complex equations $U \cdot \underline{dT} = \underline{dS}$ are actually 2N real equations that are simply solved by a real equation solving process to yield $$dT = U^{-1} \cdot dS$$

Figure 8:
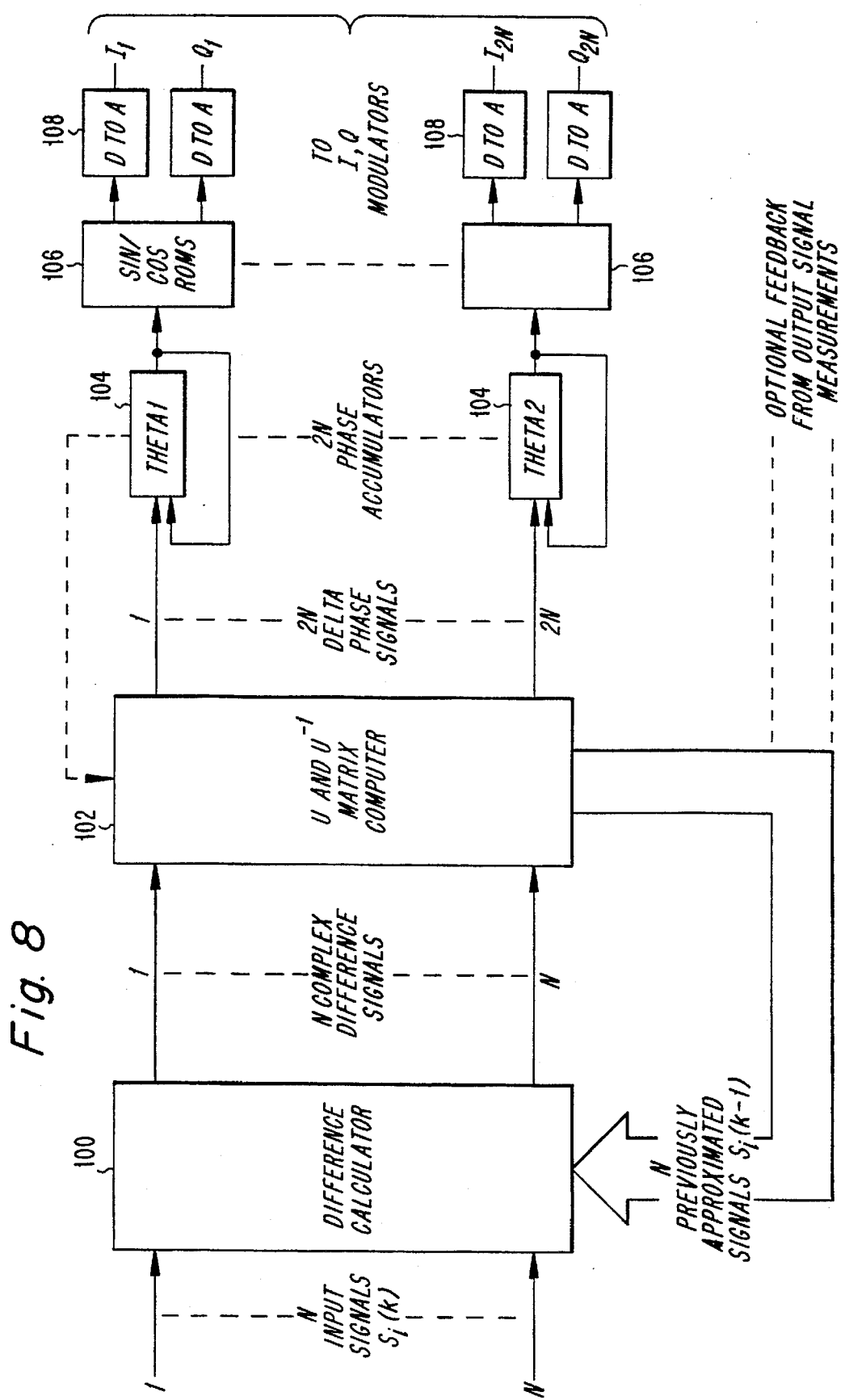
FIG. 8 illustrates a signal generator for producing phase modulated drive signals according to one embodiment of the present invention.

The dT values so found are added to corresponding $\Theta$ values to obtain new $\Theta$ values. These can be used to calculate new values of $EXP(j\Theta)$ which are the required drive signals for the power amplifiers. This conversion of $\Theta$ values to drive signals can take place by simply applying digitized Θ values to a COS/SIN look-up table or ROM to obtain values for COS(Θ) and SIN(Θ) which are the real and imaginary pans of EXP(jΘ). The numerical values of COS (Θ) and SIN(Θ) are then DtoA converted and used to drive a quadrature modulator to produce the radio-frequency drive signals as shown in FIG. 8, which will be explained in detail below. Since modern technology is capable of realizing DtoA convertors of adequate precision (e.g. 8 bits) which can run at 1000 Megasamples per second, such a digital implementation is practically useable for all practical bandwidths.

The new Θ values and the C matrix can be used to calculate the S-values actually achieved by the linearizing approximation of differentiation. Alternatively, the S-values achieved may be measured at the wanted signal outputs. Either way, it is the actually achieved values of S that are used as S(k−1) to form the differences dS with the next desired set of samples S(k). In this way, errors do not propagate and are limited. In the case where measured S values are subtracted from the next set of desired values S(k), the system can be described as N-channel Cartesian feedback. Cartesian feedback is a known technique for reducing distortion in a quasi linear power amplifier through using a signal assessment .demodulator to measure the achieved complex values of a signal at the output of a power amplifier and comparing them with desired values to produce error values. The error values are integrated and fed to a quadrature modulator to produce new values of the power amplifier drive signals that will cause the power amplifier more nearly to deliver the desired complex signal output. An advantageous method for the above is described in U.S. patent application Ser. No. 08/068,087, entitled "Selfadjusting Modulator", which is incorporated herein by reference. In the case of the above inventive matrix power amplifier, feeding back measured complex values of the N output signals so as better to achieve the next set of complex values is a form of Cartesian feedback for correcting signal matrices instead of single complex signal values.

By determining the new dS values in the above-described manner, the new Θ values are used with the C matrix to determine the new U matrix. A simplified way to perform this function is to note that the effect of adding DΘ1 to DΘ2 will be to rotate the previous values of U1j through an angle DΘ1, which causes a transfer of a fraction of their imaginary parts to their real parts and vice versa. For small values of DΘ, this allows the U matrix to be updated with no multiplies. The DΘ values can always be kept small by choosing successive sample values S(k−1), S(k), S(k+1) . . . to be sufficiently closely spaced in time. A high speed digital logic machine or computer may be envisaged for performing these calculations in real time to give continuous drive waveforms to the power amplifier stages of several MHz bandwidth. For a satellite application, such a machine is preferably located on the ground and the resulting drive waveforms only communicated to the satellite via 2N mutually coherent feeder links as disclosed in U.S. patent application Ser. No. 08/179, 953, entitled "A Cellular/Satellite Communications System With Improved Frequency Re-use", filed Jan. 11, 1994, which is expressly incorporated herein by reference.

The arrangement for calculating the phase signals is illustrated in FIG. 8. A difference calculator 100 computes the difference between the last approximation to the desired signals at instant k−1 and the new signal samples Si at instant k. The N complex differences are input to a matrix computer 102 that multiplies them by an inverse U-matrix to obtain 2N delta-phase values. The delta phase values are accumulated in 2N phase accumulators 204 to produce 2N Θ values that are converted to COSINE and SINE values using COS/SIN ROMs 106 and then DtoA converted using digital to analog convertors 108. The resulting 2N I,Q signals are passed to 2N quadrature modulators that impress the signals on the desired radio carrier frequency to obtain the signals EXP(jΘ) indicate in FIG. 7 for amplification by the constant amplitude power amplifiers.

A simplified alternative exists when the signals to be communicated Si are radio signals modulated with digital information streams. If the information streams on each of the signal paths are symbol or bit synchronous, then the waveforms Si at any instant depend on a limited number of past and future bits according to the smearing produced by the impulse response of the premodulation filtering. In the limit, an S-value in the center of a symbol at least may depend only on that symbol. With binary signalling, the symbol can only take on one of two values, 0 or 1, corresponding to an Si of +1 or −1 with suitable scaling to the desired output power and frequency. For a matrix power amplifier of limited size, for example 16 channels, this means that there can only be $2^{16}=65536$ different vectors S when sampled mid-bit. The 2N values of Θ corresponding to each of these S vectors can be precomputed and stored in a reasonably sized ROM, and may be retrieved when needed by applying the current 16-bits from the 16 channels as an address. For practical purposes, adequate shaping of the data transitions from one bit period to the next in order to control the spectrum may be obtainable by smoothly transitioning between these sets of Θ values by means of interpolation. Thus, if a particular Θ value for a current set of 16 bits being transmitted was 130 degrees and a next value was −170 degrees, the Θ value would be moved from the old value to the new by means of the sequence 135,140,145,150,155, 160,165,170,175,180,−175,−170 noting that the shortest path is taken. A Θ value that had less far to move would take the same number of smaller steps. At each step, the values of THETA would be applied via COS/SIN ROMs and DtoA convertors to a quadrature modulator in order to convert them to the desired radio-frequency drive signals for the power amplifiers.

The general principle of the present invention for obtaining multi-channel linear signal amplification using non-linear and even saturating power amplifier stages has now been explained together with a number of implementations. The aim of the present invention, to reduce the transmission of unwanted intermodulation signals produced by the power amplifier non-linearities, is achieved through choice of drive signals in a coupled power amplifier arrangement such that unwanted intermodulation is directed to an output not used for wanted signal transmission, where the unwanted energy can be dissipated as heat or light in a dummy load, or subject to a waste energy recovery procedure.

Figure 9:
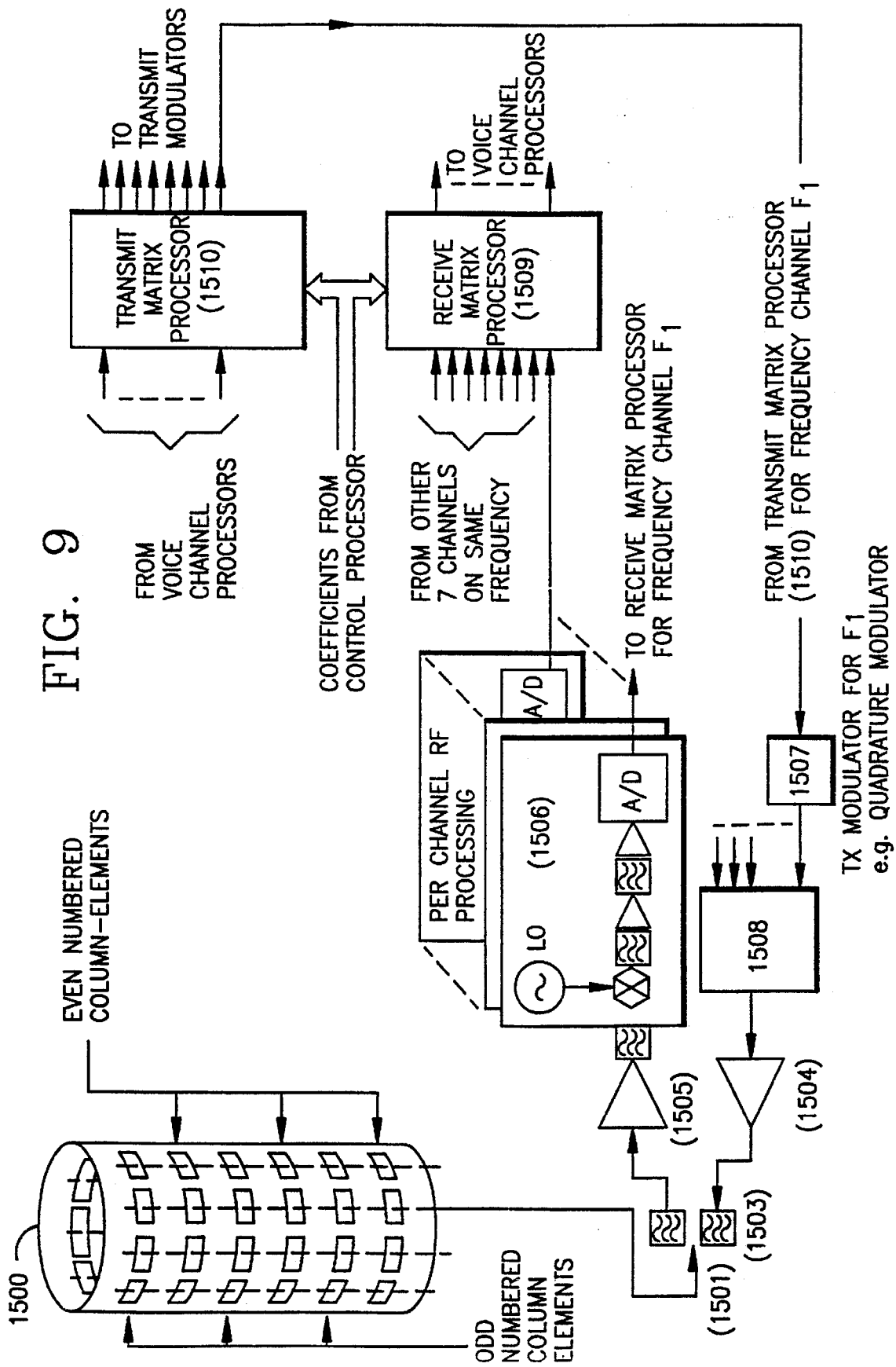
FIG. 9 illustrates a cylindrical array of slot antennas and a phase or a base station.

In another embodiment of the present invention, the amplifier outputs are not combined before being fed to a multi-beam antenna but rather are fed directly to the elements of an antenna array. FIG. 9 illustrates the use of a cylindrical array of slot antennas as might be used for a phased army base station as disclosed in U.S. patent application ser. No. 08/179,953, entitled "A Cellular/Satellite Communications System With Improved Frequency Re-use", which is incorporated herein by reference above. In such a phased array, a number of antenna elements, such as 8 horizontal columns around the cylinder and 20 vertical columns, are used for transmission or reception of signals from mobile radio telephones. For transmission, the elements in each of the vertical columns may be driven in phase from the output of a single power amplifier by use of a 20-way, passive power-splitter. Alternatively, each element may be equipped with its own associated smaller power amplifier (of ½0th the output power) and the 20 amplifiers in each column are driven in phase using the same drive signal.

Each column thus produces radiation focussed in the vertical plane but still spread over a fairly wide azimuth. When the radiation from all eight columns is evaluated however, by appropriate choice of relative amplitude and phase between the eight columns, focussing in the azimuthal plane is also produced thereby narrowing the horizontal radiation pattern and increasing the directivity gain.

When either of the above arrangements is used for transmitting multiple signals each in a different desired direction, the signal for each column comprises the sum of the different signals with an appropriate set of amplitude and phase (complex) weightings for that column. For example, the signals S1,S2,S3 . . . for the eight columns may be formed from the signals T1,T2,T3 to be transmitted as follows:

$$S1=0.5jT1+(0.7+0.1j)T2$$

$$S2=T1+(0.6+0.3j)T2+0.5jT3$$

$$S3=0.5jT1+(0.1+0.4j)T2+T3+(0.1+0.6j)T4$$

$$S4=(-0.1-0.2j)T2+0.5jT3+(0.9-0.1j)T4$$

etc., where $j=\sqrt{(-1)}$ signifying a 90-degree phase-changed component.

It can be seen that the signal Si to be amplified for application to a column of elements comprises the complex-weighted sum of the independent signals T1,T2 etc. Thus, the amplifier or amplifiers for that column have to faithfully reproduce not just a single signal (that could have been a constant amplitude signal as with analog FM) but the sum of independent signals that is not a constant amplitude signal. Thus, in prior art phased array base stations, the use of linear amplifiers that reproduced both the amplitude and phase variations of the composite drive signals is required. In U.S. Pat. No. 3,917,998 to Welti, the use of a coupled matrix of power amplifiers is disclosed with the property that no single amplifier necessarily has to generate the peak power that any one antenna element or feed may require; however the possibility of using constant-amplitude power amplifiers was not disclosed. In a previous embodiment of the present invention, the possibility of using class-C or constant amplitude power amplifiers in a coupled matrix is disclosed, through overdimensioning the matrix by a factor of two at least relative to the number of independently-specifiable amplified output signals desired. The previous embodiment consisted of a number at least 2N of class-C power amplifiers coupled at their outputs by an at least 2N+2N port Butler matrix or lossless coupling network, wherein the 2N input ports being connected to said amplifier outputs and N of said coupling network output ports being said desired amplified signal outputs, the rest being terminated in dummy loads. As a result, the unwanted intermodulation products are dissipated in the dummy loads as heat.

In the present embodiment of the present invention, the 2N+2N Butler matrix is not needed. Instead, each column of elements in the array is split into even and odd elements numbered vertically from 1 at the top to at least 2N at the bottom. In one implementation of this embodiment, elements 1,3,5 etc. of a column are connected by a passive N-way power splitter driven by a first power amplifier, while elements 2,4,6,8 . . . are connected by a second N-way power splitter driven by a second power amplifier. In a second implementation of the present embodiment, each element is equipped with a smaller power amplifier and the amplifiers attached to even elements are all driven with a first drive signal while amplifiers attached to odd elements are all driven with a second drive signal. If the drive signals are the same, radiation from the even and odd elements will reinforce in the horizontal plane, while if the drive signals are in antiphase, there will be no radiation in the horizontal plane. Thus it is possible by varying the relative phasing between in phase and antiphase to produce varying amplitudes of signal radiation in the horizontal plane even though the individual elements of the column receive constant amplitude signals from their respective power amplifiers.

For the present invention, the inventive cellular base station comprises at least one but preferably a number of such columns of vertically interlaced elements disposed with cylindric symmetry around 360 degrees of azimuth on top of an antenna tower or mast. The angular spacing of the columns is chosen principally to avoid mechanical interference between them, but may be greater than this minimum spacing if this gives the array greater horizontal directivity. As will be described below, each column of elements must be fed with two signals, to the even and odd amplifiers respectively, such that the net horizontal radiation will equate to the desired composite signals Si defined above.

If signal Si to be radiated by column i is expressed as a time-varying amplitude A(t) and a time varying phase $\Phi(t)$, then let $$D1=A_o \cdot EXP[j(\Phi+\Theta)]$$

$$D2=A_o \cdot EXP[j(\Phi+\Theta)]$$

be the time varying drive signals for the even and odd elements of colunm i, where $$\cos(\Theta)=A(t)/2A_o$$

It may be verified that, when D1 and D2 are added to calculate the radiation in the horizontal plane, we obtain $$\begin{aligned} D1+D2 &= A_o \cdot [EXP(j(\Phi+\Theta))+EXP(j(\Phi-\Theta))] \\ &= A_o \cdot [EXP(j\Theta)+EXP(-j\Theta)] \cdot EXP(j\Phi) \\ &= 2A_o \cdot \cos(\Theta) \cdot EXP(j\Phi) \\ &= 2A_o \cdot (A(t)/2A_o) \cdot EXP(j\Phi) \\ &= A(t) \cdot EXP(j\Phi), \text{ as desired.} \end{aligned}$$

The principle of the present embodiment of the present invention may be extended by dividing a column of elements into four equal groups, i.e., nos. 1,5,9 . . . 2,6,10 . . . 3,7,11 . . . 4,8,12 and so on. Each group is connected to a single power amplifier for that group by means of a power splitter, or each element is equipped with its own power amplifier and the amplifiers of a group are driven in phase with a drive signal adapted for each group. Then, a set of four drive signals is found such that desired signal radiation occurs at up to two desired elevation angles, which may if desired both be in the horizontal plane. In general, the problem of how to produce radiation of N desired signals at N desired angles of elevation from a column of at least 2N constant-amplitude radiating elements may be solved by a similar mathematical process to that described above for generating N desired signals of varying amplitude and phase using at least 2N signals of constant amplitude and varying phase.

Thus, it has been shown above how each column of elements in a cylindrical array may be arranged to produce a desired contribution to radiation at a specified angle of elevation, e.g., in the horizontal plane. It remains to be explained how the different contributions from each column are chosen so as to focus the resultant radiation also to desired angles of azimuth. This is done simply by arranging the radiation from the columns to have the complex conjugate relationship to each other compared to the signals that would be received from the desired azimuth. For example, if colunm 1 would receive from a mobile transmitter lying at 0 degrees of azimuth a signal of amplitude 0.5 and phase 120 degrees while column 2 would receive a signal of 0.7 and phase 50 degrees, that is amplitudes in the ratio 0.5:0.7 and phases differing by −70 degrees, then column 1 and column 2 should produce radiation contributions in the same amplitude ratio 0.5:0.7 for transmission but with a relative phase of +70 degrees.

The amplitude and phase relationship of the array elements for reception can be predicted from the theoretical or measured polar patterns of the constituent elements and their physical disposition in the array. Thus, the relative phases and amplitudes for transmission in any direction can be predetermined by changing the signs of the phases. It is often sufficient to quantize the number of possible directions the array can be called upon to transmit in to a limited number of beams spaced, for example, at 5 degree intervals around 360 degrees of azimuth. The phase relationships and amplitude ratios can thus be precomputed for each of these 72 directions. If the array is formed by 8 columns of elements, there exists furthermore an 8-fold symmetry such that said 72 possible phase and amplitude relationships reduce to only 9 distinct patterns that are repeated by shifting the whole pattern in steps of one column around the array. It is thus a relatively straightforward process to store these 9 patterns in a signal processor and to select the pattern and the shift needed to radiate a given signal in a given direction to the nearest 5 degrees. When this has been done for all signals desired to be radiated, and the results summed to determine the composite radiation to be produced by each column of elements, the drive signals for the constant-amplitude amplifiers associated with each column are generated using the method described above.

Figure 10:
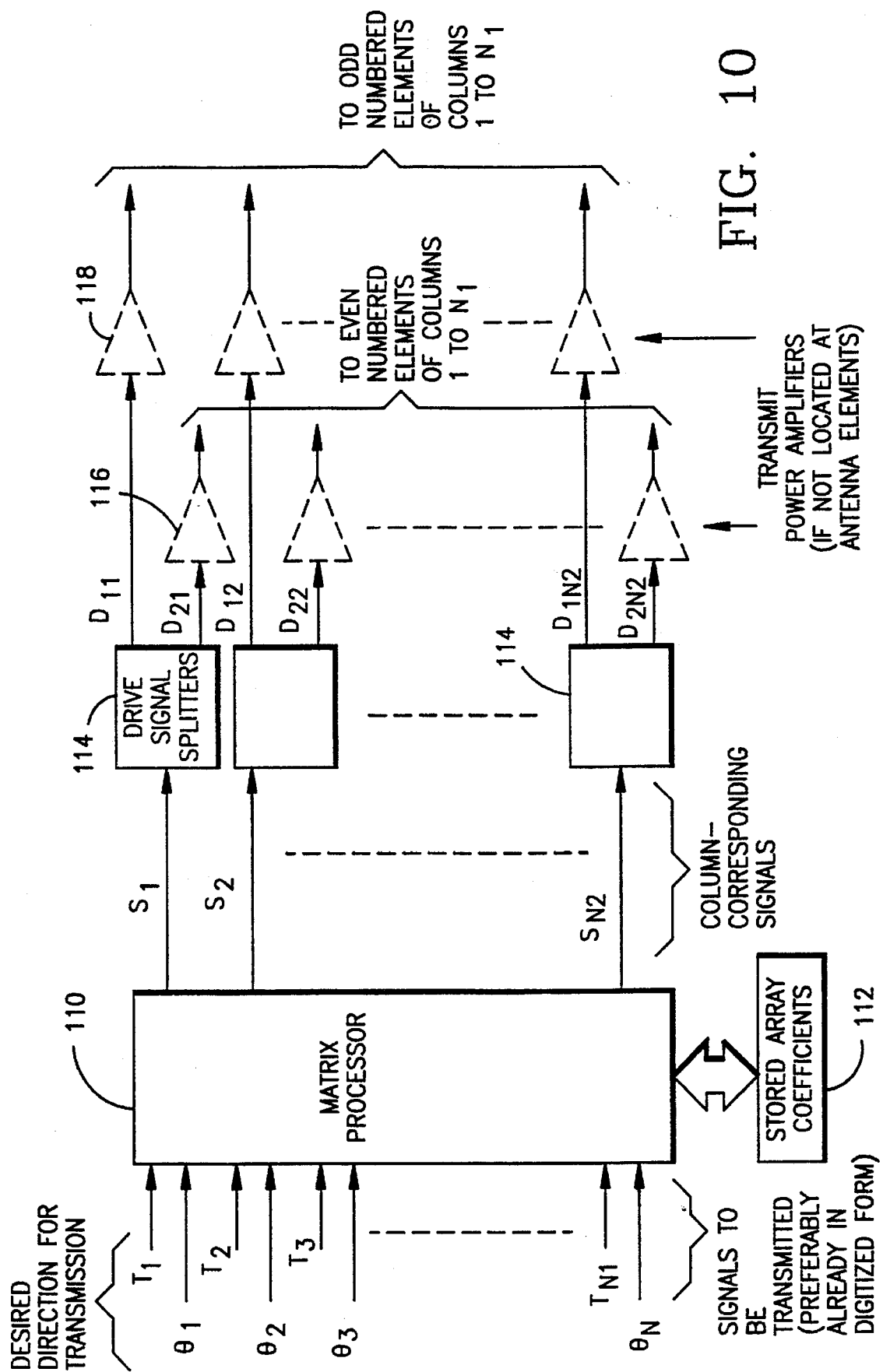
FIG. 10 illustrates a transmit array processor according to one embodiment of the present invention.

FIG. 10 illustrates a block diagram of a transmit signal processor designed to accomplish the above-described process. A set of signals to be transmitted T1,T2 . . . Tn1 along with associated direction information Θ1,Θ2 is applied to transmit matrix processor 110. Signals T1,T2 etc. are preferably in the form of a digitized sample stream produced by other signal processor(s) (not shown) that can include speech coding, error correction coding and digital conversion to modulated radio signal form. The latter represents each signal as a stream of complex numerical samples having a real and an imaginary part or alternatively in polar form using a phase and amplitude. The matrix processor 110 uses the direction information Θ1, Θ2 etc. to select or compute a set of complex weighting coefficients using stored data in a memory 112 which is adapted to the array configuration. In its simplest form, direction information Θ1, Θ2 etc. can consist of a beam number, and the beam number is used to select a set of precomputed stored coefficients from the memory 112. The coefficients are used in complex multiplication with signals T1,T2 to produce weighted sums S1,S2 . . . etc.

The complex weighting coefficients are calculated for each signal according to its desired direction of radiation and using the principle of phase-conjugating the signals that would be received from the desired direction, as disclosed above. The weighting coefficients may also be calculated such as to minimize the transmit power consumed to produce a given signal strength at the receivers, as disclosed in the incorporated U.S. patent application No. Ser. 08/179, 953, entitled "A Cellular/Satellite Communications System With Improved Frequency Re-use".

The number of sum signals produced is equal to the number of columns of array elements, which may be greater than or less than the number of signals to be transmitted. Of course, signals to be transmitted in the same direction at the same time are preferably modulated on different frequencies so that the same frequency is not used in the same beam number more than once, except in a CDMA context. The frequencies of each signal are reflected in the nature of the modulated signals T1. Alternatively, the signals T1 can be nominally represented on a zero-frequency carrier and the correct desired relative frequency applied within the matrix processor 110 by including a phase slope during a process of upsampling.

The composite output signals now represent the sum of signals at different frequencies and thus are wide band signals with a commensurately increased sample rate. Each signal Si is then converted in drive signal splitters 114 to a pair of constant amplitude signals whose sum has the desired instantaneous phase and amplitude of Si. This process of drive splitting is preferably still performed in the digital signal domain, but shortly thereafter it is appropriate to convert said drive signals to analog form with the aid of DtoA convertors. Since the numerical form consists of complex numbers, one convertor may be used for the real part and another for the imaginary part. The two signals produced are termed in the known art as I,Q signals and may be applied to a known quadrature modulator device to translate them to a desired radio frequency band. Translated signals are then amplified to a transmit power level using efficient, constant-amplitude power amplifiers 116 and 118 for even and odd column elements respectively. These amplifiers may be distributed among the array elements themselves.

It will be appreciated that the present invention may be applied similarly to arrays of elements disposed on a cylindrical surface, a planar surface, or any other surface. The general principle is to provide a superfluity of elements of preferably at least a factor of two over and above the number of distinctly different signal directions the array is desired to resolve. In this way, the array when transmitting can comprise efficient constant-amplitude power amplifiers and unwanted signal intermodulation products that arise can be arranged to be radiated in directions other than those in which the array radiates wanted signal energy. For example, an orbiting satellite carrying such an array can be arranged to irradiate the earth with wanted signals at different locations while intermodulation products (unwanted signals) are radiated harmlessly into space. In this application, the invention disclosed in the incorporated U.S. patent application Ser. No. 08/179,953, entitled "A Cellular/Satellite Communications System With Improved Frequency Re-use", may be employed to place the generation of the drive signals for said array elements and associated amplifiers on the ground, the resulting signals being conveyed to the satellite using coherent feeder links from a ground-based hub-station. An advantage of the present invention is a reduction of the heat that would normally have to be dissipated in a less efficient, linear power amplifier designed not to produce such unwanted intermodulation signals.

Another embodiment of the present invention relates to communications systems using relay stations and in particular to systems where the relay station is an earth-orbiting satellite having a communications transponder. The communications transponder receives signals broadcast from a first ground station in a first frequency band called the forward feeder link and translates them to a second frequency band called the downlink for relaying to a second ground-based station, which may be a small handportable station. The transponder is furthermore equipped with a multiplicity of such channels each having a transmit power amplifier and connected to a multiple beam antenna. The invention employs a combining network such as a Butler Matrix to connect the multiplicity of power amplifiers to the multiple beam antenna such that each amplifier amplifies a part of every desired beam signal instead of each amplifier being dedicated to amplify only a single desired beam signal.

In contrast with the prior art, an inverse Butler combining device is employed at the first ground station in order to form weighted sums of the desired beam signals for transponding using the power amplifiers. This has two advantages over the prior art method of locating the inverse Butler matrix in the satellite; firstly, dynamic reallocation of power between antenna beams may be accomplished without large variations in the corresponding forward feeder link signals; secondly, pre-distortion of signals sent on the forward feeder links may be used to partially compensate for distortion in associated transponder channel power amplifiers.

Additional advantages are provided in the preferred implementation through use of a greater number of forward feeder links and corresponding transponder channels and power amplifiers than the number of antenna beams, thus providing a degree of redundancy against failures. The latter also allows distortion products to be directed towards the unused Butler matrix output ports that are terminated in dummy loads and not connected to antenna beams.

The ability to radiate heat from an orbiting satellite can often be the dominant factor in limiting the capacity of a satellite communications system. Satellite communications systems designed to provide communication with a large number of mobile stations are of so-called multiple access type and may employ Frequency Division Multiple Access, Time-Division Multiple Access, Code Division Multiple Access, or any combination of these techniques. In FDMA or CDMA systems, a large number of signals must be radiated simultaneously leading to the problem of intermodulation in transmitters. In TDMA signals, a frame period is divided into timeslots, and each signal occupies a timeslot. Thus, in a pure TDMA system, it is not necessary to radiated many signals simultaneously, and efficient constant amplitude transmitters can be used. In practice, however, lack of available frequency spectrum requires that a fourth multiple access method also be employed, called Space Division Multiple Access (SDMA) or "Frequency Re-use". Frequency Re-use is the well-known cellular radio-telephone technique of dividing the earth into cells and permitting cells that are sufficiently separated to employ the same frequencies. Thus, even when a satellite system employs pure TDMA within each cell, it may have to employ SDMA to permit other cells to use the same frequency; thus the satellite ends up having to radiate several signals at the same time in different directions. The invention described above may be employed to allow a phased array of antenna elements with associated efficient, class-C power amplifiers to generate a number of TDMA signals for radiation instantaneously in different directions. The set of directions may change from one timeslot to the next as disclosed in U.S. patent application Ser. No. 08/179,953, entitled "A Cellular/ Satellite Communications System With Improved Frequency Re-use". The overall efficiency of such an inventive arrangement expressed in terms of conversion of DC power from a solar array or battery into usefully radiated signal energy may be no greater than if a prior art arrangement using linear amplifiers had been employed. However, the inefficiency shows up less in terms of heat dissipation, and instead as the radiation of radio energy in the form of intermodulation products harmlessly into space. Alternatively, the intermodulation may be subject to the waste energy recovery procedure herein described.

TDMA is a preferred choice for such a transponder as a communications system is often less than 100% loaded. In the TDMA case, the inventive transponder is run at maximum efficiency for active timeslots and switched off for timeslots not presently used. To accomplish this, traffic is preferably sorted so as to occupy as far as possible the same active timeslots on all beams, which ensures that the same timeslots are inactive on every beam. The entire transponder array may then be powered down for timeslots that are inactive on all beams. For timeslots that are inactive on many but not all beams, it may be efficient to power-down certain array elements only and arrange that the others are driven to maximum output to support the other beams, thus reducing heat dissipation to a minimum.

Figure 11:
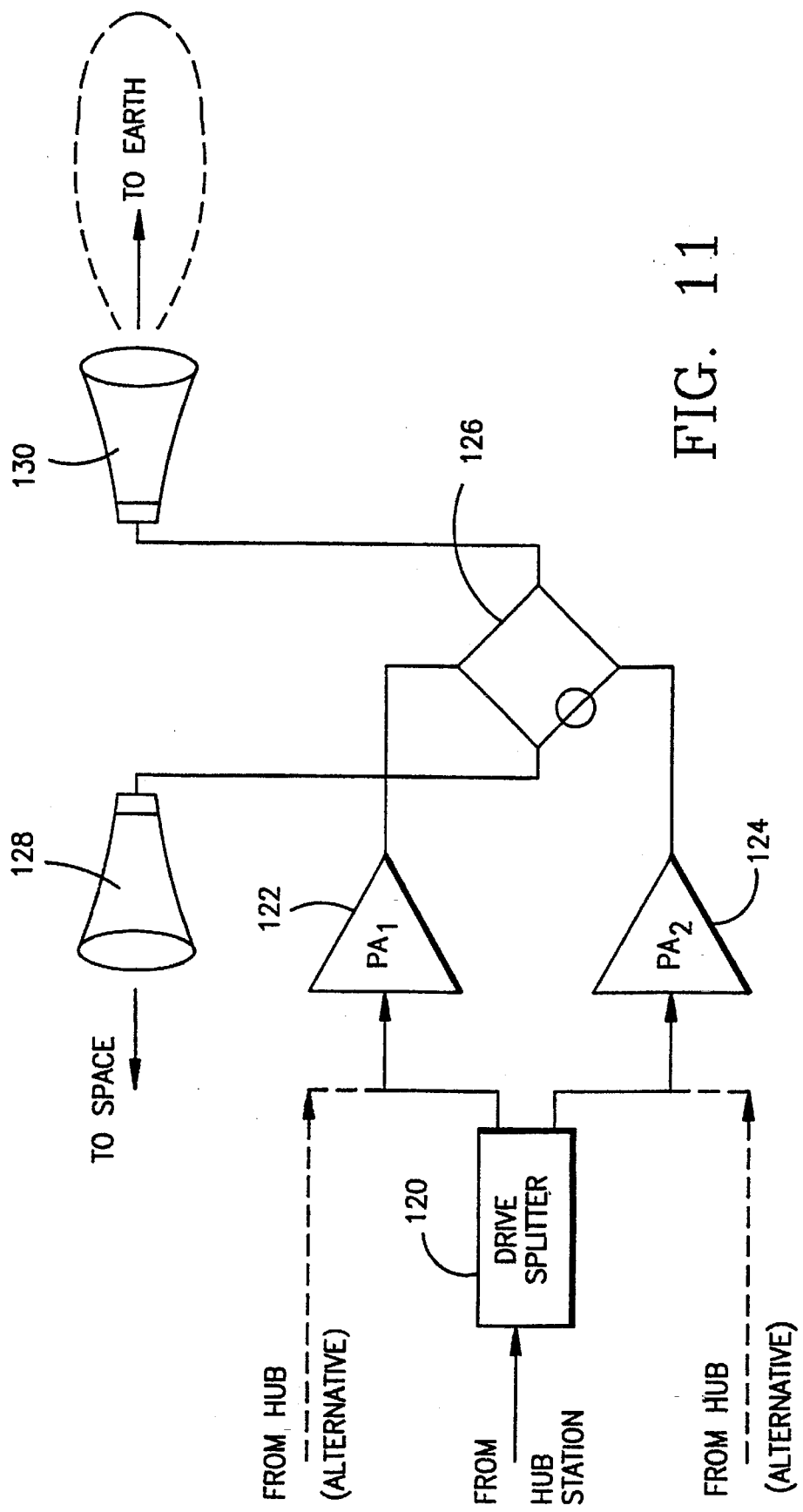
FIG. 11 illustrates a block diagram of a heat reduction method according to one embodiment of the present invention.

In its simplest form, this advantage of the current invention may be obtained using the arrangement of FIG. 11. A pair of efficient, constant-amplitude power amplifiers 122 and 124 amplify signals produced either by drive splitter 120 or separately received from the ground via two coherent feeder links. A hybrid junction 126 combines the output signals from the power amplifiers to produce a sum signal and a difference signal. The drive signals may be arranged such that either the sum or difference signal is the desired signal. In FIG. 11, the sum signal is desired and is connected to an antenna 130 such as a horn that illuminates the desired target, i.e., the earth. The difference signal then contains unwanted intermodulation products. In prior art systems, the difference signal has been dissipated in a dummy load as heat. However, the present invention provides maximum reduction of heat by instead radiating the waste energy into space by use of a separate directional antenna 128 pointed away from the earth. The simplest form of the invention may of course be extended in an obvious manner to multiple channel transponders having many beams pointed towards the earth and waste energy dissipating beams pointed away from the earth. Alternatively, the difference signal can be rectified using the inventive rectifier of FIGS. 18 or 19 and the waste energy recycled to the battery. All such arrangements are considered to be within the spirit and scope of the invention as described by the following claims.

Figure 12:
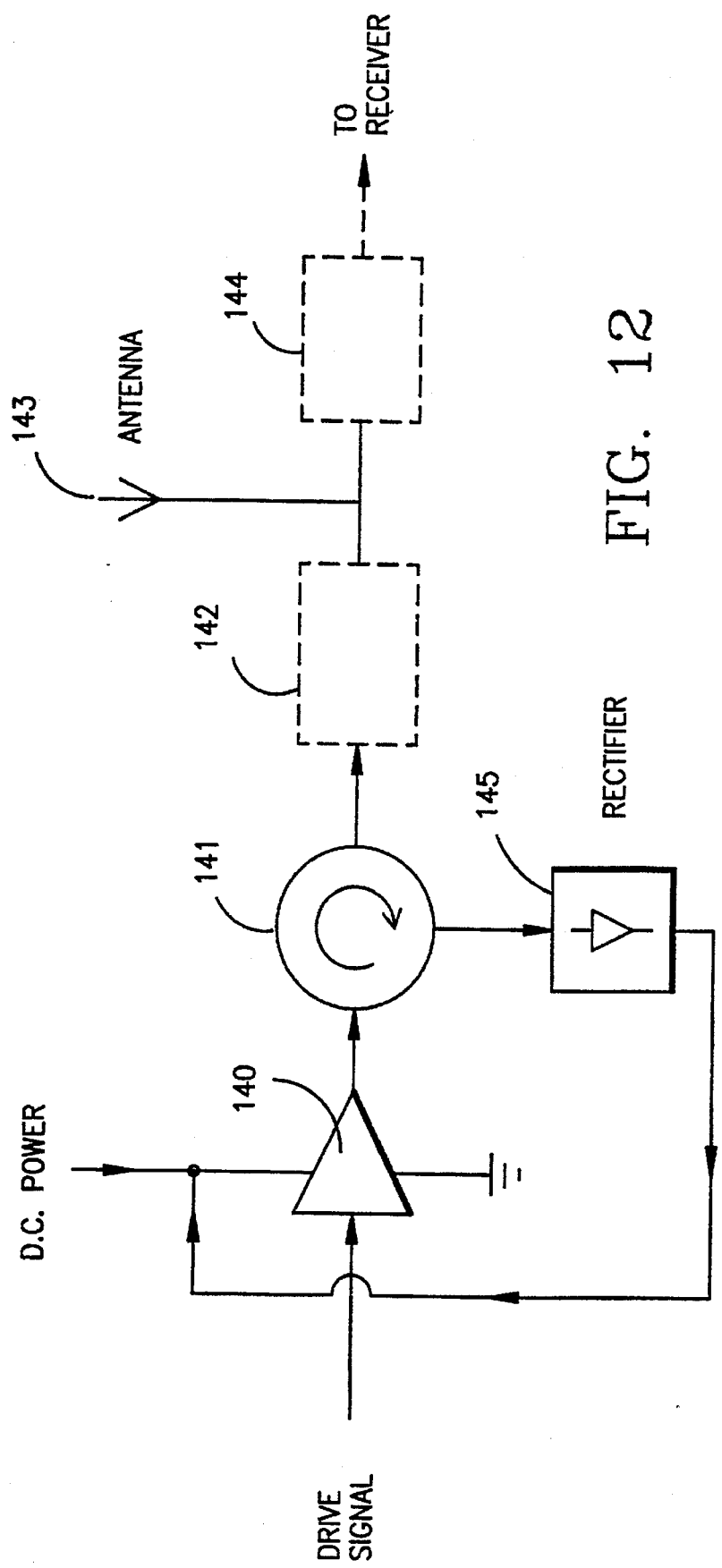
FIG. 12 illustrates a block diagram of the recovery of reflected power according to one embodiment of the present invention.
Figure 13:
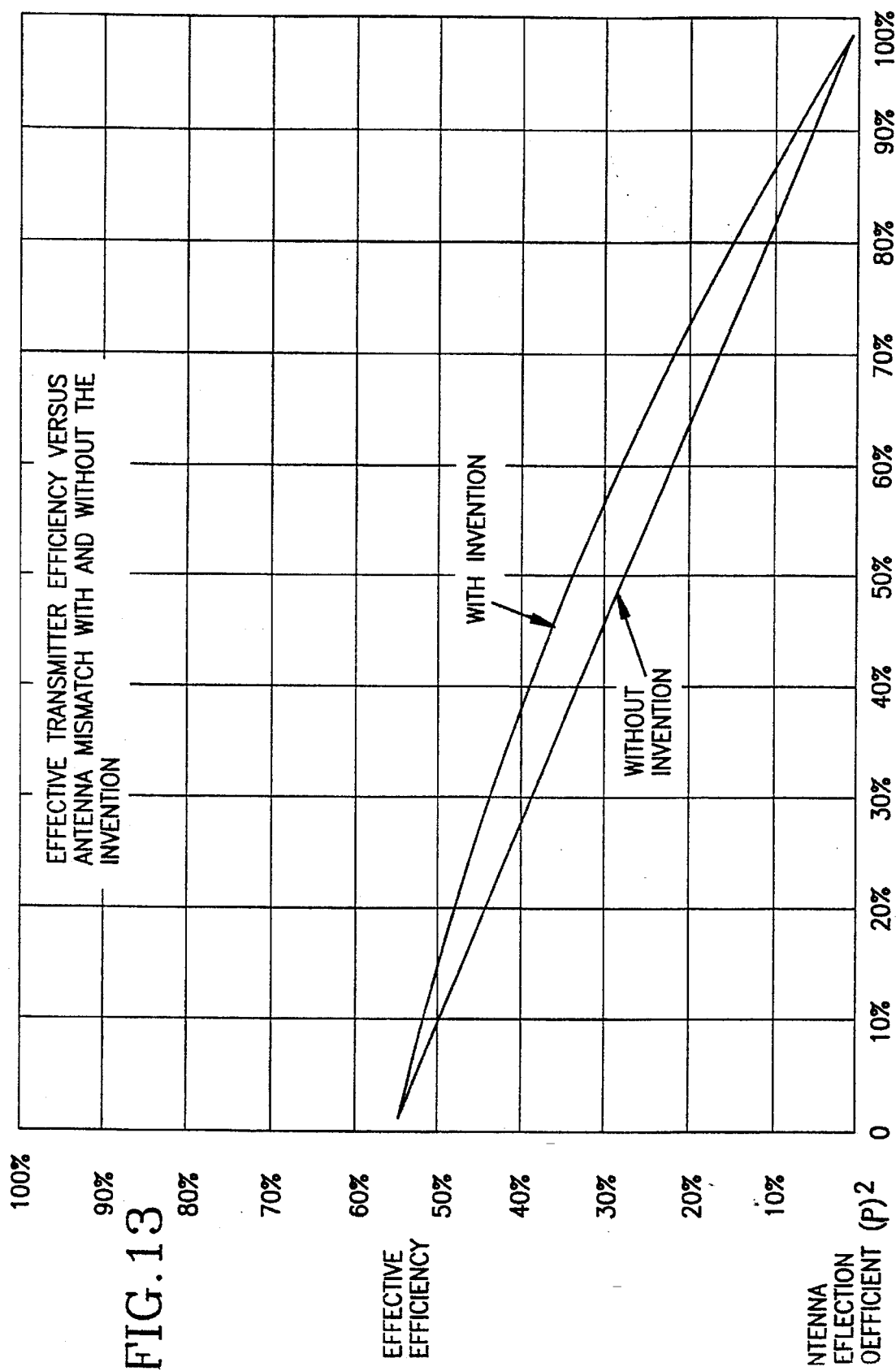
FIG. 13 illustrates a graph showing the effective transmitter efficiency versus the antenna mismatch with and without one embodiment of the present invention.
Figure 14:
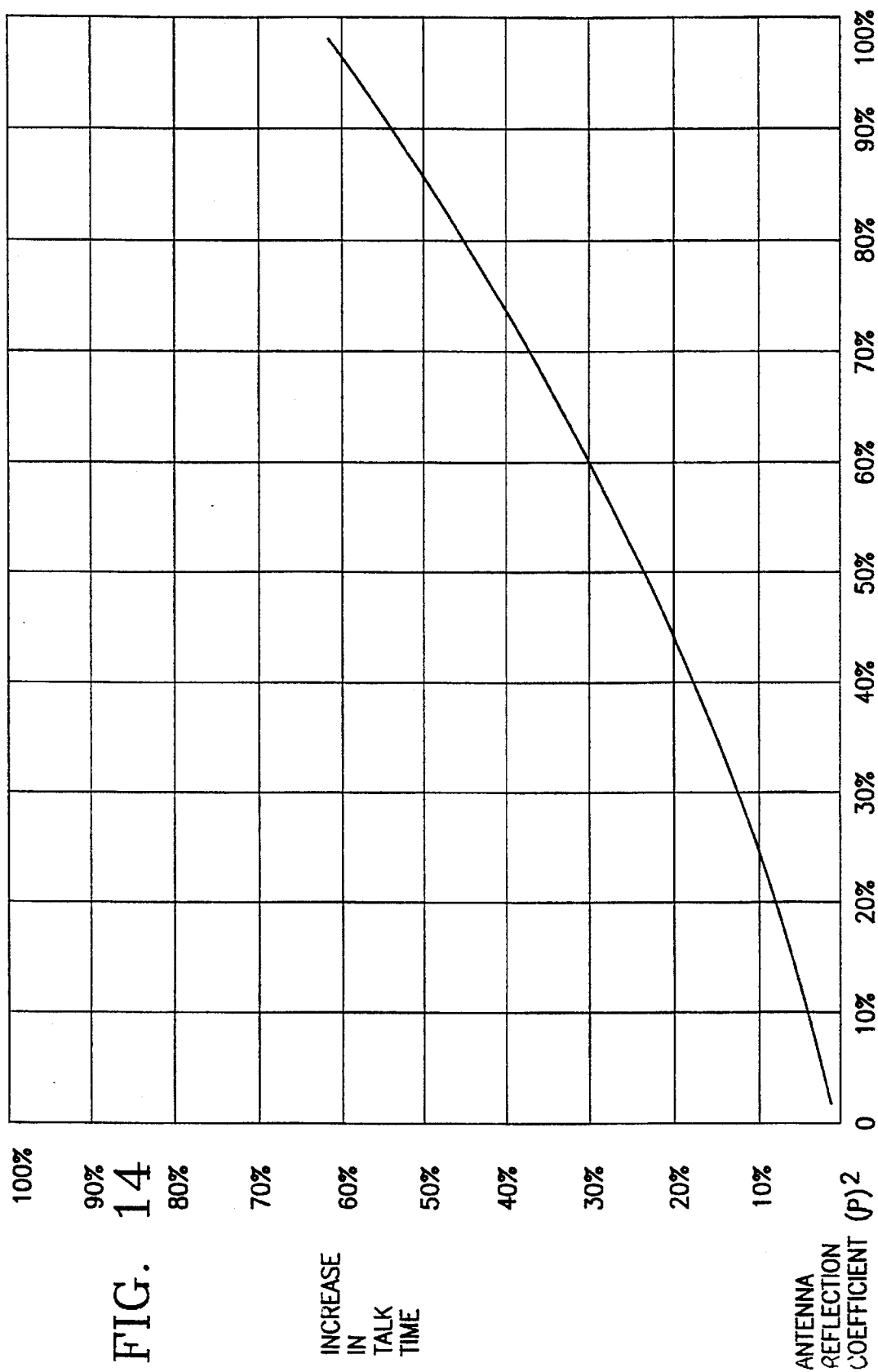
FIG. 14 illustrates in a graph the increase in talk time using one embodiment of the present invention to recycle waste energy.

Another embodiment of the present invention relates to recycling waste energy generated in a power amplifier. In FIG. 12, a power amplifier 140 is coupled through an isolator/circulator 141 and an optional transmit filter 142 to an antenna 143. In duplex systems requiring simultaneous transmission and reception on different frequencies, the transmit filter may form part of the antenna duplex filter, the other part of the filter 144 being associated with the receiver. In non-duplexing systems such as Time Division Duplex/ Time Division Multiple Access systems or simply press-to-talk systems, there may be no duplex filter but rather a transmit/receive antenna switch. The present invention is applicable to both of these configurations. In the present invention, the dummy load normally connected to the reflected power port of a circulator is replaced by a rectifier 145. The rectifier 145 converts AC radio frequency energy into a direct current which is then fed back to the battery or power source that powers the transmitter. If the efficiency of the transmitter is E1 and the efficiency of the rectifier is E2, then a fraction E1·E2 of the total energy will be recovered in the case where the antenna is a complete mismatch, reflecting all the transmitted power fed to it. The fraction E1·E2 can of course never be greater than unity. In the case where the antenna reflects a fraction R of the power fed to it, the net consumption of energy will be reduced by the factor 1-R·ER1·E2. For example, if R=10%, E1=55%, and E2=70%, the battery consumption is reduced by 3.85%, which is a significant amount of savings. When the effective energy is calculated as the ratio of the power actually radiated from the antenna to the net power consumption, the efficiency curves with and without the use of the present invention are plotted in FIG. 13. FIG. 13 shows that the effective efficiency is less sensitive to antenna mismatch when the present invention is used. FIG. 14 illustrates the percentage of increased talk-time by using the present invention, as a function of the percentage of energy reflected by the antenna.

Figure 2:
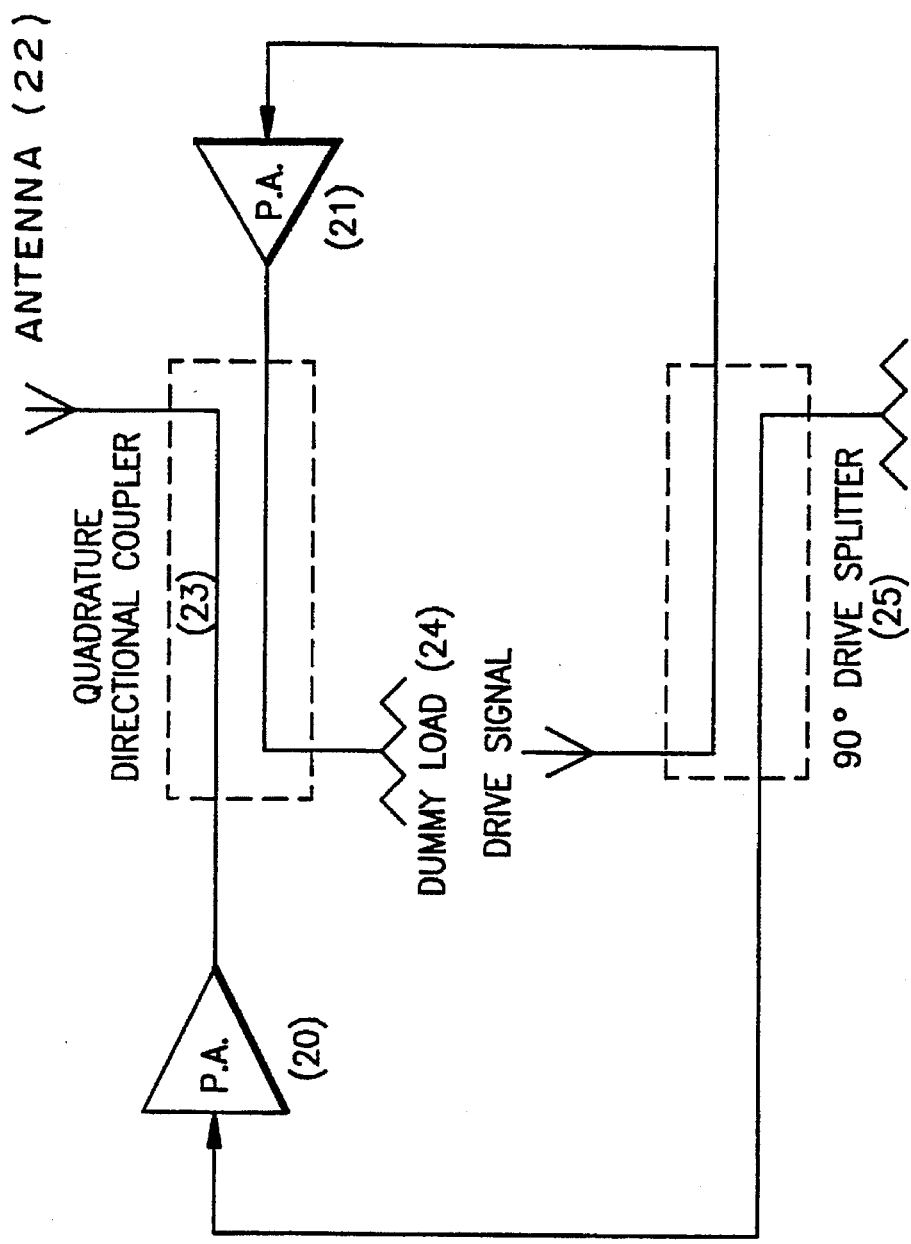
FIG. 2 illustrates a conventional quadrature coupled amplifier.
Figure 3:
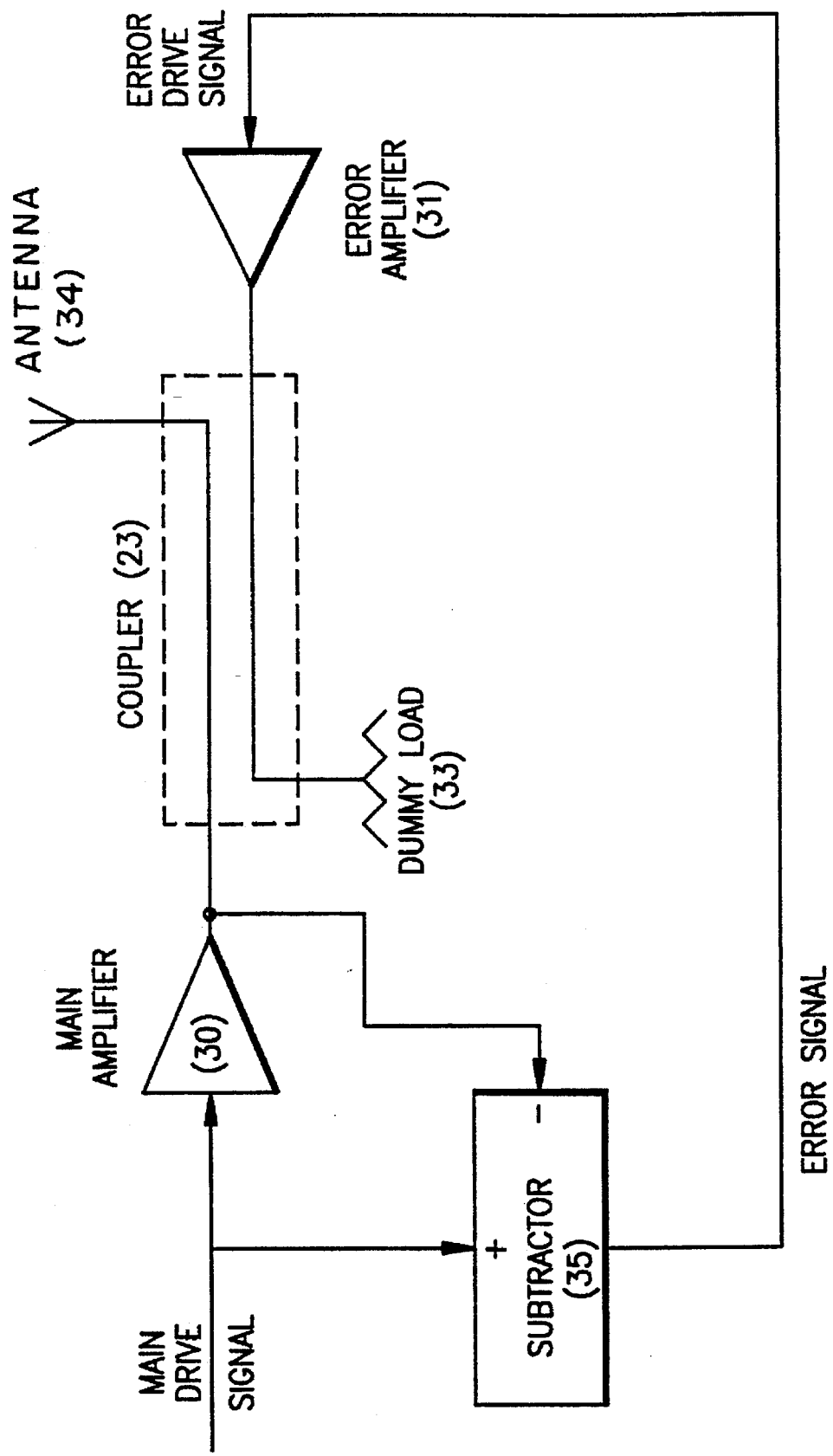
FIG. 3 illustrates a conventional feed forward linearization amplifier attached to an antenna.
Figure 15:
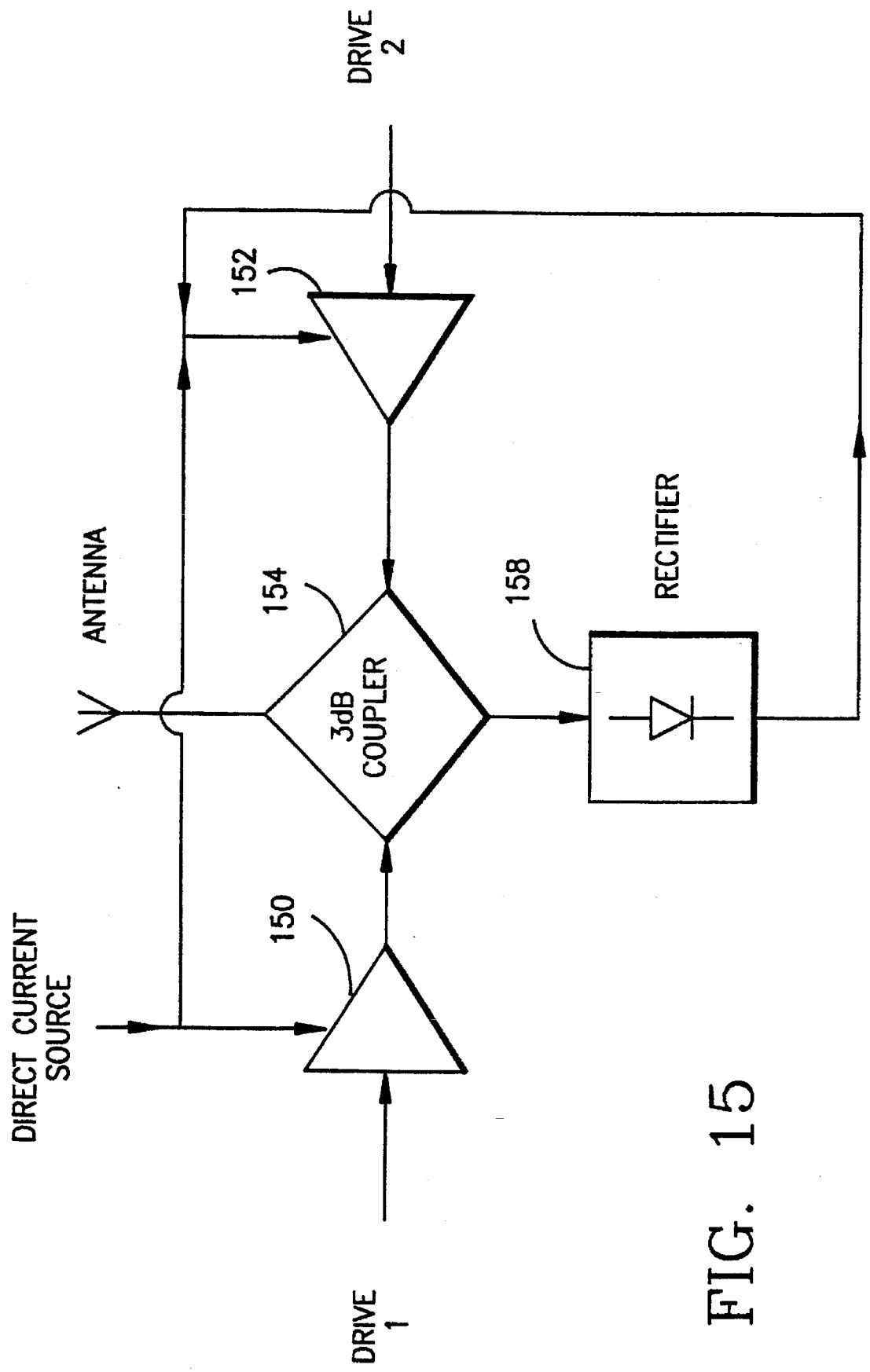
FIG. 15 illustrates the recovery of waste energy in hybrid coupled amplifiers according to one embodiment of the present invention.

Another embodiment of the present invention is illustrated in FIG. 15. Two similar power amplifier stages 150 and 152 are combined using a 3 dB directional coupler 154 in order to obtain the sum of their output powers at the antenna 156. An unwanted difference signal is produced which, instead of being dissipated in a dummy load as in FIG. 2, is converted to a DC current in rectifier 158 and the current is fed back to the battery or power source feeding the amplifiers. The same curves illustrated in FIGS. 13 and 14 apply to this embodiment as well.

Figure 16:
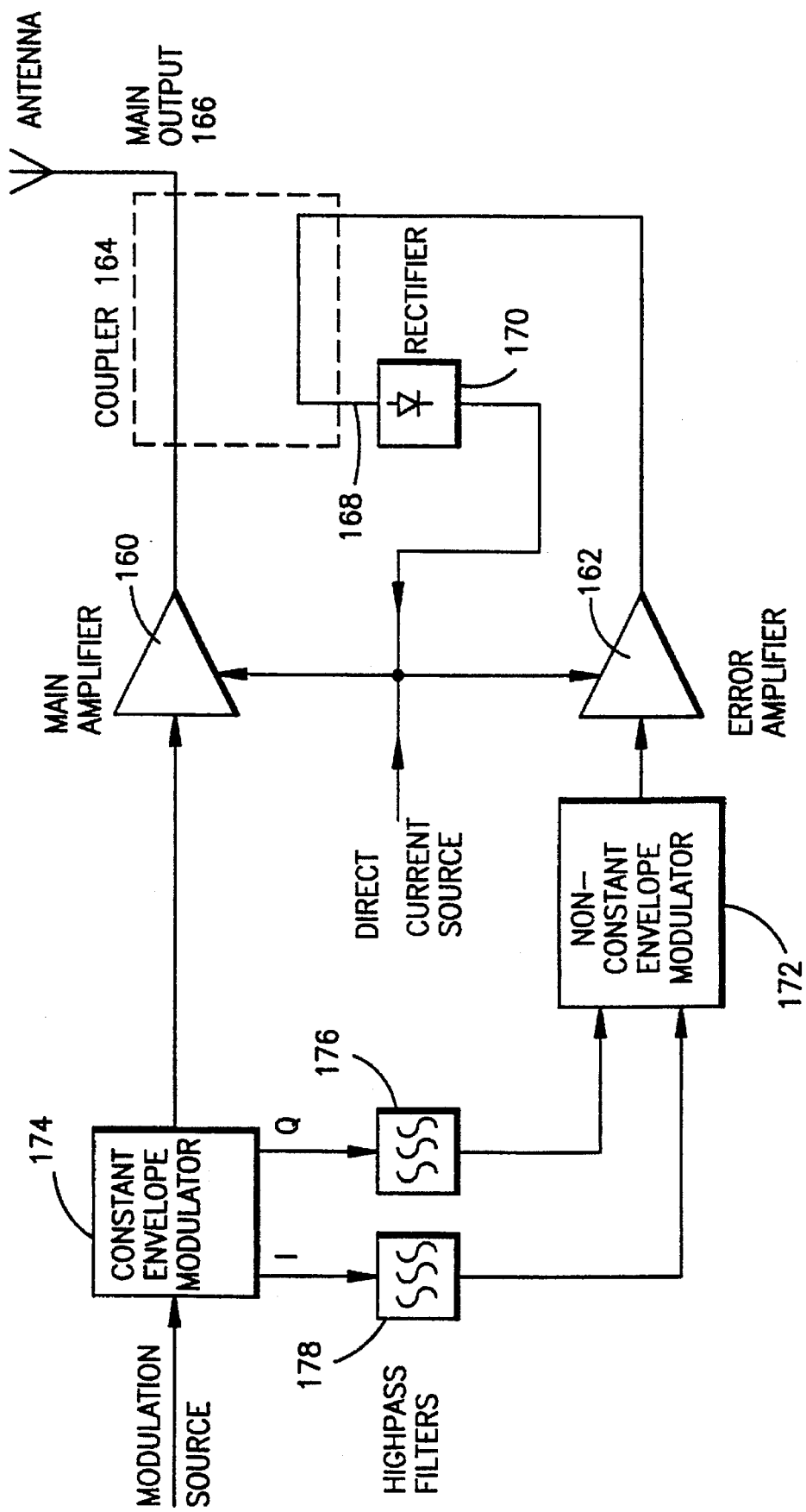
FIG. 16 illustrates a feed forward amplifier with a improved efficiency according to one embodiment of the present invention.

Another embodiment of the present invention is illustrated in connection with feedforward linearization of power amplifiers. Feedforward linearization is used to improve the linearity over that achievable with simple amplifiers, or in order to obtain improved efficiency for a given linearity. An improved efficiency feedforward amplifier is illustrated in FIG. 16 wherein the main amplifier 160 can be a class C amplifier generating a constant amplitude signal. When a higher amplitude is momentarily needed, an error amplifier 162 produces an output signal that adds to the output signal of the class C amplifier 160 in directional coupler 164. When a low amplitude is momentarily desired, the phase of the error signal is reversed, causing the error signal to be subtracted from the main output 166 in the directional coupler 164, while increasing the level of the difference signal 168. Normally, the energy in the difference signal will be dissipated in a dummy load and wasted. However, the present invention uses a rectifier 170 to convert the difference signal to a DC current which is fed back to the battery, thus recovering the energy. The size of the error amplifier 162 in relation to the main amplifier 160 and the choice of the coupling ratio of the directional coupler 164 for maximum overall efficiency must be made with the knowledge of the signal amplitude statistics.

Without the present invention, the efficiency is given by:

$$\mathit{Eff1} = \frac{(1-k^2)\overline{A^2+B^2}}{A^2/Ec + (1-k^2)\overline{B} \cdot Bpk/(k^2 \cdot EL)}$$

where k is the voltage coupling factor of the directional coupler 164,

Ec is the efficiency of the amplifier 160,

EL is the efficiency of the amplifier 162 at its maximum output amplitude Bpk,

A is the constant signal amplitude produced by the amplifier 160,

B is the difference between A and the desired output signal waveform that must be contributed by amplifier 162, Bpk is the peak amplitude of signal waveform B, and overlining signifies mean value over time.

When using the present invention, the effective efficiency is given by:

$$\mathit{Eff1} = \frac{(1-k^2)\overline{A^2+B^2}}{A^2/Ec + (1-k^2)\overline{B} \cdot Bpk/(k^2 \cdot EL) - R \cdot \overline{D^2}}$$

where R is the rectifier efficiency and D is the difference signal given by $$D = k(A+B) - B/k$$

Another embodiment of the present invention relates to recovering waste energy in high power base station transmitters for multiple carrier operation. When a cellular base station is required to support multiple conversations with mobile stations on different frequencies, the first choice for the transmitter design is between a single, high-power multi-carder power amplifier and a multiplicity of lower power single carrier amplifiers. The multi-carder amplifier must be linear and is very inefficient because of the high peak to mean ratio of the composite, multi-carrier signal. In the case where feedforward linearization is used, the present invention can be employed to recover waste energy from the difference port of an output coupler.

If the single carrier amplifier approach is selected, means must be provided to connect the plurality of amplifiers to the antenna. Multiple antennas are not favorable because they tend to be large, expensive and need more real estate. One way to couple multiple amplifiers to the antenna is to use a multicoupling filter, which uses frequency selectivity to isolate the different amplifiers from one another. Multicoupling filters are large, and expensive and are only feasible when the frequency difference between the multiple carders is not too small. The alternative is to use dissipative combining, in which amplifiers may be combined in pairs using hybrid couplers or directional couplers, which are essentially sum and difference networks. Using dissipative combining for two signals, for example, a power amplifier of power 2 P is used for a first signal and a second power amplifier of output power 2 P for a second signal. The outputs of the two power amplifiers are then combined using a 3 dB coupler. The coupler allows half of the power of each power amplifier, i.e., P from each power amplifier, to reach the antenna while the other half is normally dissipated in a dummy load. In general, dissipative combining of N signals requires that each signal be amplified to a power N times the desired power P, so that the total power of all N amplifiers is N×NP, while only NP (P from each amplifier) reaches the antenna. Where N is a power of 2, the dissipative combiner is a binary tree which combines pairs of signals and then pairs of pairs and so on to the final output. Each pair-combining network may be a 3 dB coupler.

Figure 17:
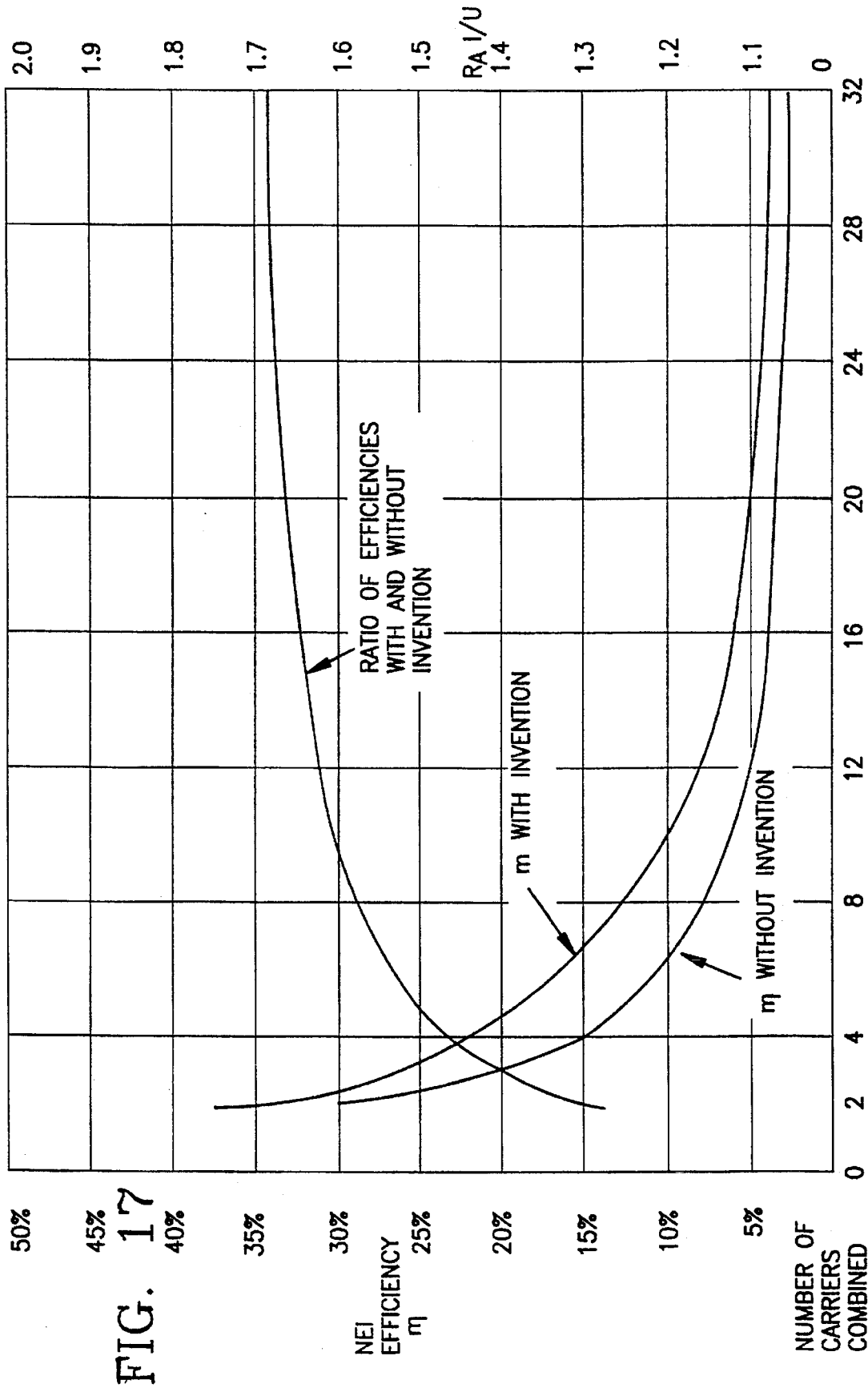
FIG. 17 illustrates a graph of the multi-carder transmitter efficiency according to one embodiment of the present invention.

At each coupler, half of the power is extracted in a sum signal and passed to the next coupler or to the final output, while the other half is normally wasted in a dummy load. Thus, half the total power is wasted in combining two carriers, ¾ of the total power is wasted in combining four carriers, and in general a fraction (N−1)/N of the total power is wasted when N carriers are combined. By employing the current invention, this normally wasted power is recovered at least to the extent of the rectifier efficiency R. Thus, instead of the net efficiency being only E/N where E is the efficiency of one single carrier power amplifier, the effective efficiency becomes $E/(N-(N-1)E\cdot R)$. For example, when $E=60\%$ and $R=70\%$, the effective efficiency is plotted versus N in FIG. 17 with and without the present invention. The figure illustrates that efficiency can be improved by a factor of more than 1.5 by using the present invention.

In multicarrier transmitters it is generally desired to minimize the production of unwanted frequency components caused by intermodulation between the carrier frequencies. These components appear at frequencies such as $2f1-f2$ or $2f2-f1$ if the hybrid couplers do not perfectly isolate the transmitter on f1 from the transmitter on f2. However, the inclusion of a rectifier on the difference port of the coupler can, if no care is taken, greatly contribute to the generation of intermodulation components. This phenomenon is related to the more general problem of how to produce a rectifier that transfers energy from a variable voltage AC source to a fixed DC voltage. Of course, a solution that can be used is to incorporate a regulator, preferably a pulse width modulation type, i.e., switched-mode type, between the variable DC output of the rectifier and the fixed voltage to which it is to be connected. However, an alternative and novel solution is disclosed below which employs no active circuitry.

Figure 18:
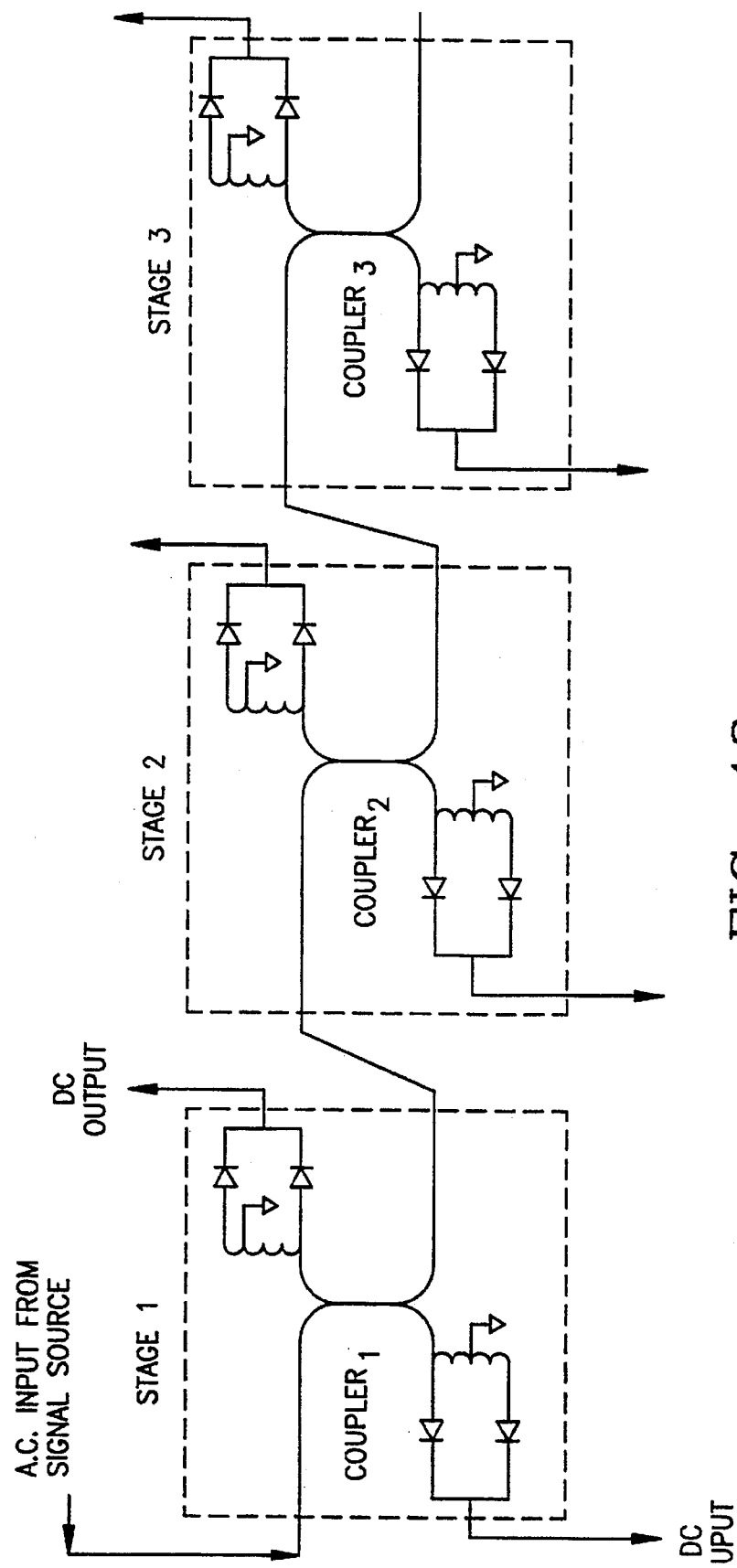
FIG. 18 illustrates a wide dynamic range rectifier circuit according to one embodiment of the present invention.

FIG. 18 illustrates a wide dynamic range rectifying circuit with a cascade of diode rectifier stages, each stage being composed of a quadrature coupler driving a pair of identical diode rectifiers, and preferably full wave rectifiers. A quadrature coupler has the property that when terminated with two identical load impedances, any energy reflected from a load impedance mismatch is output to the so-called isolated port and not returned to the source. The AC load impedance presented by each full-wave rectifier is in fact equal to the DC load impedance, which in turn is equal to the output voltage, i.e., the fixed supply voltage to which the rectified energy is to be recycled, divided by the rectified current. Because the rectified current varies with the AC signal amplitude while the output voltage is constrained to a fixed value, the rectifier presents a variable load impedance which is not therefore matched to the source, which causes inefficiency and intermodulation. However, in the novel configuration illustrated in FIG. 18, the power reflected when the rectifier load deviates from a perfect match is transferred to the isolated port and not returned to the source. As a result, this energy has a second chance to be recovered in the second rectifier stage, and so on. By designing each rectifier stage to be efficient at the level of residual power passed to it from a preceding stage, the net reflection effect of the cascade of rectifiers is the product of that of the individual stages, ensuring that at all source power levels in question, little energy is reflected and that the great majority is rectified and transferred to the fixed voltage level. This novel rectifier circuit thus adapts a variable voltage AC source to a fixed DC voltage without the use of active regulators.

Figure 19:
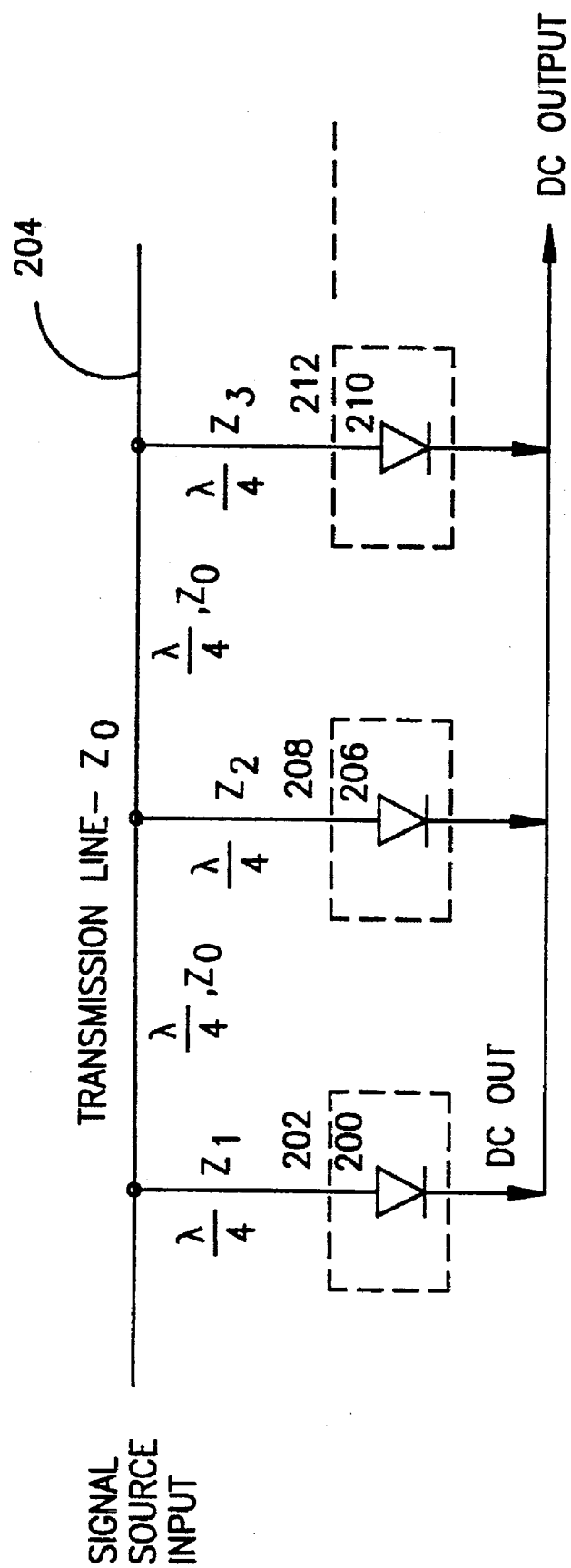
FIG. 19 illustrates a wide dynamic range rectifier based upon quarter-wave transformer.

Other constructions of such rectifiers can also be designed. For example, another embodiment of the present invention is illustrated in FIG. 19. A first rectifier stage 200 is connected via a quarter wave matching transformer 202 to the near end of a transmission line 204 and is matched to the source impedance. This first rectifier is adapted by choice of matching transformer 202 efficiently to rectify small signals. For larger signals, the rectifier presents a reduced impedance which, at the junction of 202 and 204, translates into an increased impedance by virtue of the reciprocal impedance transformation performed by a quarter wave transformer. Therefore, at larger signal levels, the first rectifier does not load the transmission line 204 as much. A second rectifier stage 206 is connected via a second quarter wave matching transformer 208 to a point ¼ wavelength downstream on the transmission line 204. This second rectifier is adapted to be below the threshold of rectification for the small signal levels for which the first rectifier is adapted. Thus, it presents a high impedance to the second quarter wave matching transformer 208 which translates to a low impedance at the junction of 208 and 204. One quarter wavelength nearer the source at the junction of 204 and 202, this translates to a high impedance again, thus not loading rectifier 200. Consequently, source energy is primarily absorbed by rectifier 200 at small signal levels and primarily by rectifier 206 at large signal levels. The principle may be extended by the addition of further rectifiers with associated matching transformers. progressively at ¼ wavelength increments down transmission line 204 in order to produce a rectifier device that converts energy from an AC source of any voltage level to a fixed DC voltage. A person ordinarily skilled in the art will also recognize that discrete component equivalents of the disclosed transmission line or coupler networks can be built, as well as waveguide circuits or circuits employing circulators in order to achieve the same goal, and all such constructions which achieve adaptation of a variable voltage AC source to a fixed DC voltage level are considered to fall within the scope of the relevant invention.

It will be appreciated by those of ordinary skill in the art that the present invention can be embodied in other specific forms without department from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalence thereof are intended to be embraced therein.

We claim:

1. An amplifying apparatus for linearly amplifying input signals to desired power levels, comprising:

Butler matrix means for combining a first plurality of input signals and producing a first plurality of output signals which are combinations of input signals, wherein said input signals are inputted into said Butler matrix through input ports which are selected so as to provide optimum spacing for said input signals;

a second plurality of coupled, non-linear power amplifier stages for amplifying said combinations of the input signals, wherein the second plurality is larger than the first plurality; and second Butler matrix means for combining said amplified combinations of the input signals; said second Butler matrix means outputting a first plurality of wanted output signals and a third plurality of unwanted signals, wherein the third plurality is the difference between the second plurality and the first plurality.

2. The amplifying apparatus according to claim 1, wherein said coupled power amplifier stages are coupled at their outputs by a passive, lossless network having said second plurality of inputs coupled to said amplifier outputs and said first plurality of wanted outputs signals and the third plurality of unwanted signals connected to waste energy dissipating means.

3. The amplifying apparatus according to claim 2 in which said waste energy dissipating means is a dummy load or light bulb.

* * * * *